United States Patent
Suzuki et al.

(10) Patent No.: US 6,781,404 B2
(45) Date of Patent: Aug. 24, 2004

(54) SEMICONDUCTOR INTEGRATED CIRCUIT AND MANUFACTURING METHOD THEREOF

(75) Inventors: Yasuyuki Suzuki, Tokyo (JP); Kenichi Hosoya, Tokyo (JP); Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/093,449

(22) Filed: Mar. 11, 2002

(65) Prior Publication Data

US 2002/0158659 A1 Oct. 31, 2002

(30) Foreign Application Priority Data

Mar. 12, 2001 (JP) ........................................ 2001-069029

(51) Int. Cl.[7] .............................................. H03K 19/003
(52) U.S. Cl. .............................. 326/30; 326/86; 326/90; 327/108
(58) Field of Search .............................. 326/30, 26, 47, 326/101, 124, 126, 86, 90; 327/108

(56) References Cited

U.S. PATENT DOCUMENTS

| | | | | |
|---|---|---|---|---|
| 5,341,039 A | | 8/1994 | Fukumoto ..................... | 307/443 |
| 5,939,922 A | * | 8/1999 | Umeda ......................... | 327/333 |
| 6,208,161 B1 | * | 3/2001 | Suda ............................ | 326/30 |
| 6,265,893 B1 | * | 7/2001 | Bates ........................... | 326/30 |
| 6,426,646 B2 | * | 7/2002 | Yoshizawa et al. ........... | 326/30 |

FOREIGN PATENT DOCUMENTS

| | | |
|---|---|---|
| JP | 9-162653 | 6/1997 |
| JP | 2842463 | 10/1998 |

* cited by examiner

*Primary Examiner*—Vibol Tan
(74) *Attorney, Agent, or Firm*—Foley & Lardner LLP

(57) ABSTRACT

A semiconductor integrated circuit including interconnect for connecting a current switch circuit and an emitter follower circuit and a method for producing the semiconductor integrated circuit. A matching between a characteristic impedance of the interconnect and an output impedance of the current switch circuit at its output and also an input impedance of the emitter follower circuit at its input in a predetermined frequency range is conducted to prevent an occurrence of distortion of a waveform of a data signal and a gain peaking of frequency characteristic. An impedance converter circuit can be placed at the input or output of the interconnect to match the characteristic impedance of the interconnect.

35 Claims, 19 Drawing Sheets

CURRENT SWITCH CIRCUIT    EMITTER FOLLOWER CIRCUIT

F I G. 6
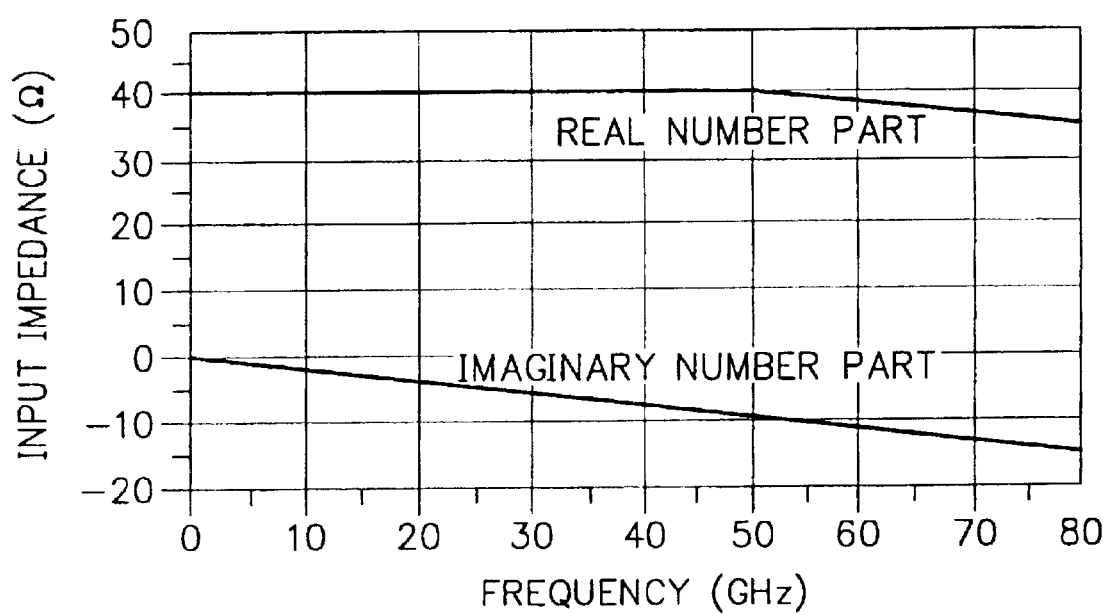

FIRST EMITTER
FOLLOWER CIRCUIT    410    SECOND EMITTER
FOLLOWER CIRCUIT

F I G. 16
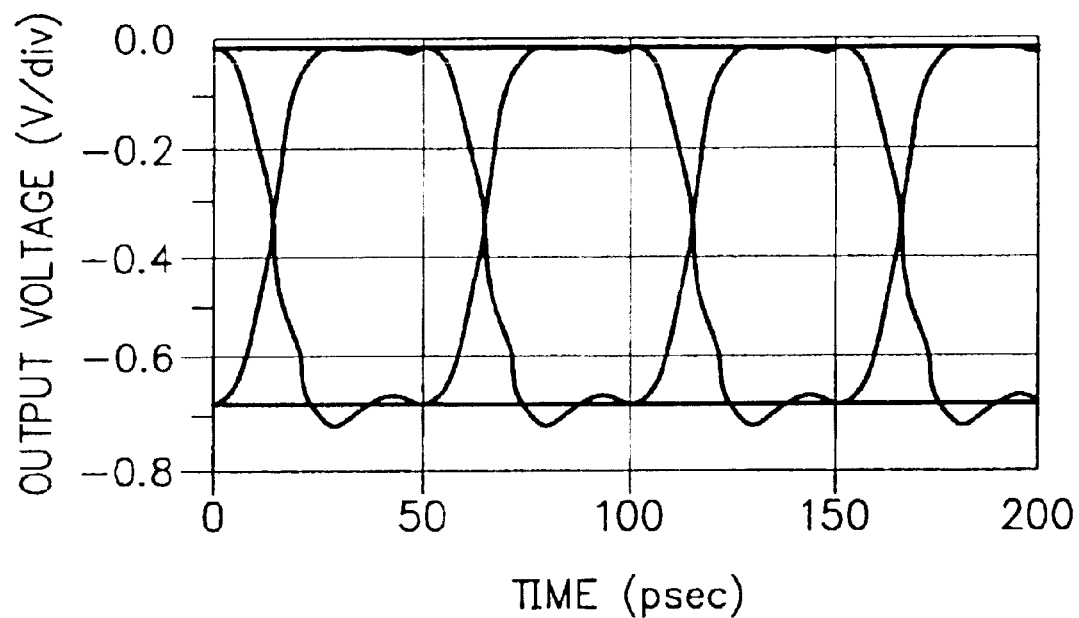

(a)

(b)

(c)

FIRST EMITTER FOLLOWER CIRCUIT

SECOND EMITTER FOLLOWER CIRCUIT

F I G. 20
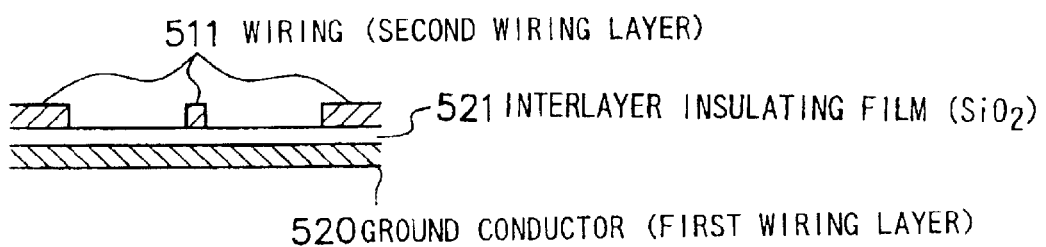

CURRENT SWITCH CIRCUIT    EMITTER FOLLOWER CIRCUIT

F I G. 24
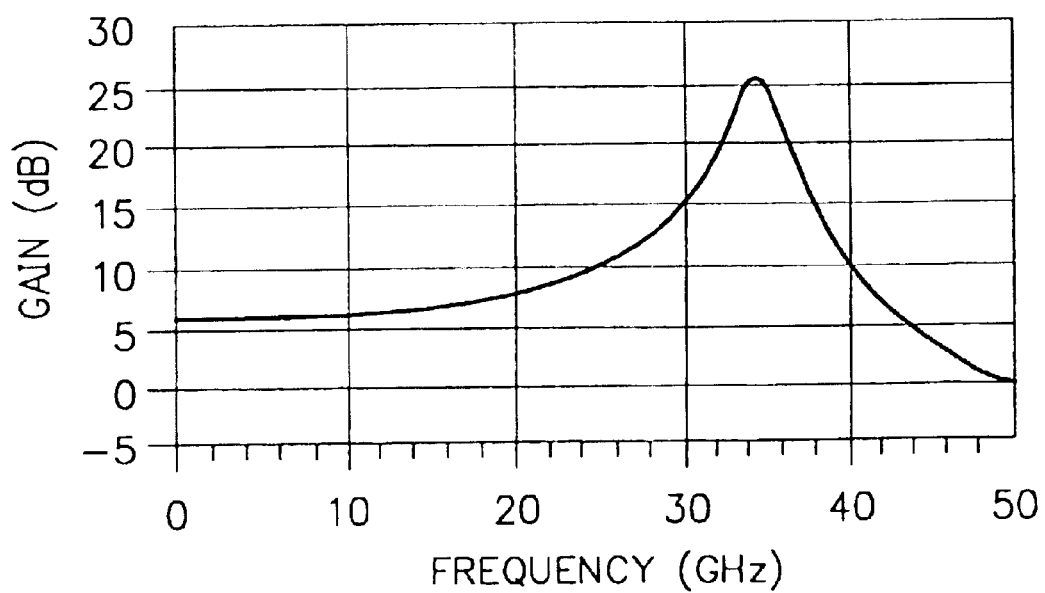

SEMICONDUCTOR INTEGRATED CIRCUIT AND MANUFACTURING METHOD THEREOF

BACKGROUND OF THE INVENTION

The present invention relates to a semiconductor integrated circuit and more particularly to a semiconductor integrated circuit for quickly processing broadband data signals, and a manufacturing method such a semiconductor integrated circuit.

RELATED PRIOR ART

Recently, as a highly information signal processing has been demanded, an IC (integrated circuit) capable of processing signals at high speed has been needed. In order to realize a higher speed operation of ICs, in order to realize high integration transistors used the ICs, they have been formulated in highly performance quality and advanced by shortening interconnect lengths to reduce interconnect delay time of the ICs.

High performance of an element can be obtained by basically reducing the size of the element. For example, in the case of a field effect transistor, by reducing a gate length, and in the case of a bipolar transistor, by reducing a base thickness and an emitter width, a current gain cut-off frequency is improved and by reducing peripheral parts, a parasitic capacitance is reduced, thereby realizing more powerful transistors.

As the transistors have been miniaturized and high performed, there is a problem with a parasitic capacitance of the interconnect within a chip arises, and thus a possibly short distance layout between elements by a micro-manufacturing and high integration using multi-layered interconnect have been proposed.

In FIG. 1, there is shown a conventional emitter coupled logic (ECL) circuit as a fundamental logic circuit using bipolar transistors. This ECL circuit comprises a current switch circuit (differential circuit) and an emitter follower circuit.

The current switch circuit is a circuit that emitters of a pair of driving transistors 603 and 604 are connected in common. Both of the emitters of the driving transistors 603 and 604 are connected to a collector of constant current source transistor 607 in common. Collectors of the transistors 603 and 604 are connected in common to a connection line via a pair of load resistors 605 and 606, respectively and a high level power supply terminal 608 is coupled to the connection line.

The emitter follower circuit comprises a pair of input transistors 612 and 613 and a pair of load resistors 614 and 615. The bases of the two input transistors 612 and 613 are connected to the collectors of the two drive transistors 603 and 604, respectively. The emitters of the two input transistors 612 and 613 are commonly linked to the emitter of the constant current source transistor 607 via the respective load resistors 614 and 615 and a connection line and this connection line is coupled to a low power supply terminal 609. The collectors of the two input transistors 612 and 613 are connected in common to the connection line coupled to the high level power supply terminal 608. Two output terminals 616 and 617 of the ELC circuit are connected to the respective connection lines connecting the emitters of the input transistors 612 and 613 and the load resistors 614 and 615, respectively.

In this ECL circuit, with high performance of each transistor, the high integration is realized by shortening the interconnect between the current switch circuit and the emitter follower circuit and the interconnect within these two circuits in order to reduce interconnect delay time are shortened to intend the high integration. As a result, the high speed operation of the ECL circuit can be realized.

In recent years, a signal speed of the data to be used has become a high frequency such as GHz order and in such a high frequency band, the influence of the high frequency has not been considered up to this time but cannot become ignored even in the shortened interconnect, interconnect length of several tens of $\mu$m to several hundreds of $\mu$m. For example, in a distribution constant model of interconnect, propagation time $\tau$ (sec/m) is expressed as follows;

$$\tau = \sqrt{LC} (=(LC)^{1/2})$$

In this formula, L is inductance of interconnect and C is capacitance of the interconnect. From this formula, it is found that with the rise of the data signal speed such as GHz order (or about 1 GHz or more), it is necessary to reduce the values of L and C. Furthermore, when the load capacitance of the interconnect increases, the rising of the data signal is delayed, which leads to problem of the delay and the inability of the signal propagation.

In order to reduce the delay time, a circuit using air-bridge interconnect having a low parasitic capacitance is known. However, owing to an inductor component of the interconnect, distortion occurs in the data signal even within the circuit. As one example, in FIG. 2, there is shown a two-stage ECL circuit constituting two current switch circuits and four emitter follower circuits.

In FIG. 2, the two-stage ECL circuit includes the first ECL circuit having two inputs and outputs shown in FIG. 1 and the second ECL circuit having a similar construction to the first ECL circuit. The outputs of the first ECL circuit are input to the second ECL circuit via two interconnects 638 and 639. In the first ECL circuit shown in FIG. 2, the same members as those shown in FIG. 1 are designated by the same numerals and thus the explanation thereof can be omitted.

The second ECL circuit includes one current switch circuit and one emitter follower circuit in the same manner as the first ECL circuit. In this case, the emitter follower circuit of the first ECL circuit is called the first stage emitter follower circuit and the emitter follower circuit of the second ECL circuit is the second stage emitter follower circuit.

In the second stage emitter follower circuit includes a pair of input transistors 616 and 617 and a pair of load resistors 618 and 619. More specifically, the base of the input transistor 616 is coupled to the connection line connecting the emitter of the input transistor 612 of the first emitter follower circuit and the load resistor 614 via the interconnect 638, and the base of the input transistor 617 is coupled with to the connection line connecting the emitter of the input transistor 613 of the first emitter follower circuit and the load resistor 615 via the interconnect 639. The emitters of the two input transistors 616 and 617 are connected in common to a connection line via the respective load resistors 618 and 619, and this connection line is coupled to the low level power supply terminal 609. The collectors of the two input transistors 618 and 619 are connected in common to a connection line to which the high level power supply terminal 608 is coupled.

The current switch circuit of the second stage ECL circuit, in the same manner as the first ECL circuit, includes a pair of drive transistors 623 and 624, a constant current source transistor 627 and a pair of load resistors 625 and 626. The emitters of the two drive transistors 623 and 624 are commonly coupled with the collector of the constant current source transistor 627. The base of the drive transistor 623 is connected to the connection line connecting the emitter of the input transistor 616 and the load resistor 618, and the base of the drive transistor 624 is connected to the connection line connecting the emitter of the input transistor 617 and the load resistor 619. The collectors of the two drive transistors 623 and 624 are connected in common to the connection line via the respective load resistors 625 and 626, and this connection line is coupled to the high level power supply terminal 608. The emitter of the constant current source transistor 627 is linked to the connection line to which the low level power supply terminal 609 is coupled.

In the two stage ECL circuit, like the ECL circuit shown in FIG. 1, the current switch circuit and the emitter follower circuit are connected by the interconnect and the transistors and the resistors within the circuits are connected by the interconnect. However, only the interconnects 638 and 639 coupling the first emitter follower circuit with the second emitter follower circuit will now be considered.

FIG. 3 shows a cross sectional view of the interconnects 638 and 639 for coupling the first and the second emitter follower circuits of the conventional two-stage ECL circuit. The back surface of a semiconductor substrate on which the ECL circuit is formed, is an ground 630. A interconnecting layer of Au such as the interconnects 638 and 639 having a thickness of 1 $\mu$m and a width of 6 $\mu$m is formed on the ground 630 via a semiconductor layer 631 of a GaAs layer having a thickness of 120 $\mu$m. A interconnect length of the interconnecting layer is 500 $\mu$m.

In FIG. 4, there is shown a frequency characteristic of from DC to 50 GHz gain of the aforementioned two-stage ECL circuit. Although the interconnect length between the first emitter follower circuit and the second emitter follower circuit is shorter than a wavelength of a quarter of 50 GHz, since the length of the interconnects 638 and 639 is 500 $\mu$m, it is found that the gain peaking around 27 GHz.

When a data signal having a pseudo-random pattern of 20 Gbit/sec shown in FIG. 5 is input to the two-stage ECL circuit, as its output waveform is shown in FIG. 6, distortion comes about in the data signal by the interconnects 638 and 639 having the interconnect length of 500 $\mu$m and hence none of the amplification and propagation of the correct data signal can be carried out.

In the actual interconnect, R, L and C components are included and the resistance components of the L and C are expressed by j$\omega$L and j$\omega$C. When the speed of the data signal is fast, the value $\omega$ becomes large, and thereby its influence is large even when the L and C are small. Hence, when the speed of the data signal becomes fast, a mismatch arises in the impedance between the interconnect and its front stage circuit or the interconnect and its post stage circuit. The afore-mentioned gain peaking and the distortion of the data signal are mainly caused by this impedance mismatching.

When the impedance mismatching occurs between the interconnect and its front stage circuit or the interconnect and its rear stage circuit, the reflection of the signal is caused at the mismatching part. By this reflection, overshoot (or undershoot) or a ringing is caused in the signal waveform and the signal waveform is disturbed. Further, a problem of the delay by this reflection, for example, the delay of the rise time due to the signal reflection arises.

As described above, the frequency becomes higher (the interval between rising time and the fall time of the data signal become shorter), the characteristic impedance of the shortened interconnect is necessarily considered. However, heretofore, since the characteristic impedance of such a interconnect has not been considered conventionally, when the frequency becomes high, the distortion of the data signal or the gain peaking of the frequency characteristic occurs and the data signal cannot be propagated well.

In Japanese Patent Laid-open Application No. Hei 9-162653, a high frequency differential output circuit includes a differential pair of field effect transistors and a constant current circuit of a field effect transistor, and further includes an inductive circuit for preventing a parasitic capacitance of the field effect transistor from affecting a bad influence to an impedance characteristic of an output terminal by an inductive impedance of the inductive circuit. However, in this case, additional interconnect for connecting the inductive circuit to the field effect transistor is necessary and it becomes disadvantageous to realize high integration and low cost.

In Japanese Patent No. 2842463, in order to reduce reflection of a transmission signal generated at a part that an impedance of interconnect coupling electronic circuits is discontinuously changed, for example, a part that a interconnect width is narrowed, a reflection reduction circuit including a first resistor connected between the interconnect and a power source potential and a second resistor connected between the interconnect and an earth potential is placed near the impedance discontinuously changing part of the interconnect. However, in this case, the reflection of the signal at the discontinuous part of the interconnect can be reduced, but the aforementioned problem of the reflection caused by the impedance mismatching between the interconnect and its front stage circuit or between the interconnect and its rear stage circuit cannot be solved.

SUMMARY OF THE INVENTION

It is therefore an object of the present invention to solve the afore-mentioned problems of the prior art and to provide a semiconductor integrated circuit and a method for producing a semiconductor integrated circuit, which is capable of preventing an occurrence of distortion of a data signal and a gain peaking of a frequency characteristic.

In accordance with one aspect of the present invention, there is provided a semiconductor integrated circuit comprising: a first circuit having an output terminal; a second circuit having an input terminal; and interconnect for connecting the output terminal of the first circuit and the input terminal of the second circuit, a characteristic impedance of the interconnect matching an output impedance of the first circuit in a predetermined frequency range.

The semiconductor integrated circuit of the present invention can further comprise an impedance converter circuit connected between the interconnect and the output terminal of the first circuit.

In accordance with another aspect of the present invention, there is provided a semiconductor integrated circuit comprising: a first circuit having an output terminal; a second circuit having an input terminal; and interconnect for connecting the output terminal of the first circuit and the input terminal of the second circuit, a characteristic impedance of the interconnect matching an input impedance of the second circuit in a predetermined frequency range.

The semiconductor integrated circuit of the present invention can further comprise an impedance converter circuit connected between the interconnect and the input terminal of the second circuit.

In accordance with another aspect of the present invention, there is provided a semiconductor integrated circuit comprising: a first circuit having an output terminal; a second circuit having an input terminal; and interconnect for connecting the output terminal of the first circuit and the input terminal of the second circuit, a characteristic impedance of the interconnect matching both an output impedance of the first circuit and an input impedance of the second circuit in a predetermined frequency range.

The semiconductor integrated circuit of the present invention can further comprise a first impedance converter circuit connected between the interconnect and the output terminal of the first circuit and a second impedance converter circuit connected between the interconnect and the input terminal of the second circuit.

In a semiconductor integrated circuit of the present invention, the predetermined frequency range includes a frequency that distortion is caused in a waveform of a data signal propagating the interconnect by either an inductor or capacitance of the interconnect.

In a semiconductor integrated circuit of the present invention, the characteristic impedance of the interconnect is determined so that an eye opening ratio representing a rate of an amplitude size of an eye pattern of a data signal propagating the interconnect to the amplitude size of the eye pattern of the data signal input to the output terminal of the first circuit may be larger than a predetermined value.

In a semiconductor integrated circuit of the present invention, assuming that the output impedance of the first circuit, the input impedance of the second circuit, the characteristic impedance of the interconnect and the eye opening ratio are R1, R2, Z0 and M, respectively, these values can satisfy the following formulas in a frequency range for the data signal propagating the interconnect.

$$\left| \frac{Z_0}{Z_0 + R_1} \left[ 1 + \frac{R_2 - Z_0}{R_2 + Z_0} \right] - \frac{R_2}{R_1 + R_2} \right| < \frac{1-M}{2} \quad (1)$$

and $$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1-M}{2} \quad (2)$$

In a semiconductor integrated circuit of the present invention, assuming that the output impedance of the first circuit, the input impedance of the second circuit, the characteristic impedance of the interconnect and the eye opening ratio are $R_1$, $R_2$, $Z_0$ and M, respectively, these values can satisfy the following formula in a frequency range for the data signal propagating the interconnect.

$$\left| \frac{Z_0}{Z_0 + R_1} \left[ 1 + \frac{R_2 - Z_0}{R_2 + Z_1} \right] - \frac{R_2}{R_1 + R_2} \right| < \frac{1-M}{2} \quad (1)$$

In a semiconductor integrated circuit of the present invention, assuming that the output impedance of the first circuit, the input impedance of the second circuit, the characteristic impedance of the interconnect and the eye opening ratio are R1, R2, Z0 and M, respectively, these values can satisfy the following formula in a frequency range for the data signal propagating the interconnect.

$$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1-M}{2} \quad (2)$$

In a semiconductor integrated circuit of the present invention, the interconnect, the first circuit and the second circuit are formed on a same semiconductor substrate to obtain the semiconductor integrated circuit having a monolithic structure.

In accordance with another aspect of the present invention, there is provided a method for producing a semiconductor integrated circuit, comprising the steps of forming a first circuit having an output terminal and a second circuit having an input terminal on a semiconductor substrate; and forming interconnect for connecting the output terminal of the first circuit and the input terminal of the second circuit, a characteristic impedance of the interconnect being determined so that an eye opening ratio representing a rate of an amplitude size of an eye pattern of a data signal propagating the interconnect to the amplitude size of the eye pattern of the data signal input to the output terminal of the first circuit may be larger than a predetermined value.

In a method for producing a semiconductor integrated circuit of the present invention, assuming that an output impedance of the first circuit, an input impedance of the second circuit, the characteristic impedance of the interconnect and the eye opening ratio are R1, R2, Z0 and M, respectively, these values can satisfy the following formulas in a frequency range for the data signal propagating the interconnect.

$$\left| \frac{Z_0}{Z_0 + R_1} \left[ 1 + \frac{R_2 - Z_0}{R_2 + Z_0} \right] - \frac{R_2}{R_1 + R_2} \right| < \frac{1-M}{2} \quad (1)$$

and $$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1-M}{2} \quad (2)$$

In a method for producing a semiconductor integrated circuit of the present invention, assuming that an output impedance of the first circuit, an input impedance of the second circuit, the characteristic impedance of the interconnect and the eye opening ratio are R1, R2, Z0 and M, respectively, these values can satisfy the following formula in a frequency range for the data signal propagating the interconnect.

$$\left| \frac{Z_0}{Z_0 + R_1} \left[ 1 + \frac{R_2 - Z_0}{R_2 + Z_0} \right] - \frac{R_2}{R_1 + R_2} \right| < \frac{1-M}{2} \quad (1)$$

In a method for producing a semiconductor integrated circuit of the present invention, assuming that an output impedance of the first circuit, an input impedance of the second circuit, the characteristic impedance of the interconnect and the eye opening ratio are R1, R2, Z0 and M, respectively, these values can satisfy the following formula in a frequency range for the data signal propagating the interconnect.

$$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1-M}{2} \quad (2)$$

The method for producing a semiconductor integrated circuit of the present invention can further comprise forming an impedance converter circuit connected between the interconnect and the output terminal of the first circuit, and it is assumed that the output impedance, converted by the impedance converter circuit, of the first circuit is R1.

The method for producing a semiconductor integrated circuit of the present invention can further comprise forming an impedance converter circuit connected between the interconnect and the input terminal of the second circuit, and it is assumed that the input impedance, converted by the impedance converter circuit, of the second circuit is R2.

In general, a characteristic impedance of interconnect and an output impedance and an input impedance of circuits constituting a semiconductor integrated circuit can be known by calculations (simulation). For example, the characteristic impedance of the interconnect can be calculated on the basis of its width, thickness, dielectric constant and the like. As described above, according to the present invention, the characteristic impedance of the interconnect is adapted to match the output impedance of the first circuit, the input impedance of the second circuit, or both the output impedance and the input impedance of the first and the second circuits in a predetermined frequency range (the frequency that the distortion is caused in the waveform of the data signal propagating the interconnect by the inductor or capacitance of the interconnect, more specifically, the frequency of the order of GHz), and thus none of the distortion of the data signal and the gain peaking can be caused. Further, the inductive circuit mentioned in the Japanese Patent Laid-open Publication No. 9-162653 is not necessary. In particular, in the case that the characteristic impedance of the interconnect is set so that an eye opening ratio may be larger than a predetermined value, the occurrence of the distortion in the data signal waveform owing to the reflection can be exactly prevented.

Furthermore, assuming that an output impedance of a first circuit, an input impedance of a second circuit, a characteristic impedance of interconnect and an eye opening ratio of a data signal (pulse signal) propagating the interconnect are R1, R2, Z0 and M, respectively, it is found from various experimental results up to this time that when these values satisfy at least one of the following two formulas in a frequency range for the data signal propagating the interconnect, $$\left| \frac{Z_0}{Z_0 + R_1} \left[ 1 + \frac{R_2 - Z_0}{R_2 + Z_0} \right] - \frac{R_2}{R_1 + R_2} \right| < \frac{1 - M}{2} \quad (1)$$

and $$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1 - M}{2} \quad (2)$$

the matching between the characteristic impedance of the interconnect and at least one of the output impedance of the first circuit and the input impedance of the second circuit can be made and an occurrence of distortion in the waveform of the data signal propagating the interconnect owing to reflection caused by an impedance mismatching can be prevented and a good data signal transmission can be performed. The formula (i) mainly restricts a size of overshoot, caused by the reflection, of the data signal waveform and the formula (ii) mainly restricts a size of undershoot, caused by the reflection, of the data signal waveform. In the present invention, an open state of an aperture of an eye pattern of the data signal waveform can be set to a certain range by using the formulas (i) and (ii) so that the data signal may be propagated. Hence, the occurrence of the distortion of the data signal waveform owing to the reflection can be exactly prevented.

BRIEF DESCRIPTION OF THE DRAWINGS

The objects, features and advantages of the present invention will become more apparent from the consideration of the following detailed description, taken in conjunction with the accompanying drawings, in which:

FIG. 6 is a waveform chart showing an example of a waveform of the output data signal of the conventional two-stage emitter coupled logic circuit shown in FIG. 2;

FIG. 16 is a graphical representation showing for explaining principle of an input impedance of an emitter follower circuit of the emitter coupled logic circuit shown in FIG. 14;

FIG. 20 is a graphical representation for explaining principle of showing an output impedance of the first emitter follower circuit of the semiconductor integrated circuit shown in FIG. 18 at an output terminal of an impedance converter circuit;

FIG. 24 is a circuit diagram showing a configuration a semiconductor integrated circuit according to the fifth embodiment of the present invention;

DESCRIPTION OF THE PREFERRED EMBODIMENTS

Figure 7:
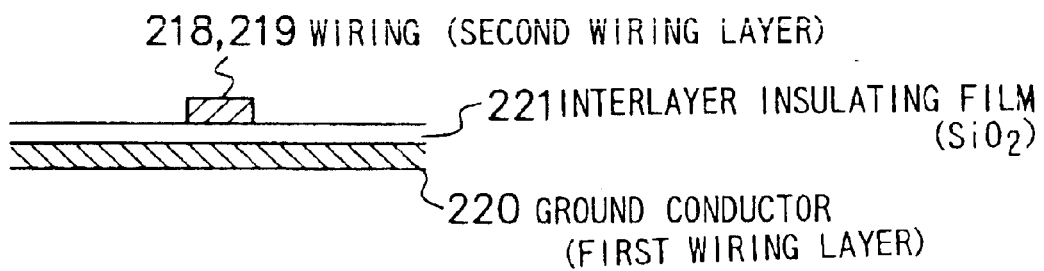
FIG. 7 is a circuit diagram showing a configuration of a semiconductor integrated circuit of an emitter coupled logic circuit according to the first embodiment of the present invention.

Referring now to the drawings, in FIG. 7, there is shown a semiconductor integrated circuit of an emitter coupled logic (ECL) circuit according to the first embodiment of the present invention. This ECL circuit includes a current switch circuit and an emitter follower circuit.

First Embodiment

In FIG. 7, the current switch circuit includes a pair of drive circuits 103 and 104, a pair of load resistors 105 and 106 and a constant current source transistor 109. More specifically, two input terminals 101 and 102 are connected to the bases of the two drive transistors 103 and 104 and the emitters of the two drive transistors 103 and 104 are commonly coupled with the collector of the constant current source transistor 109. The collectors of the two drive transistors 103 and 104 are connected in common to a connection line via the respective load resistors 105 and 106 and this connection line is coupled to a high level power supply terminal 116. Two output terminals 107 and 108 of this current switch circuit are connected to the respective connection lines connecting the collectors of the two drive transistors 103 and 104 and the two load resistors 105 and 106, respectively.

The emitter follower circuit includes a pair of input transistors 112 and 113 and a pair of load resistors 114 and 115. That is, two input terminals 110 and 111 are coupled with the bases of the two input transistors 112 and 113, respectively. The emitters of the two input transistors 112 and 113 are commonly linked to the emitter of the constant current source transistor 109 via the respective load resistors 114 and 115 and a connection line coupled to a low level power supply terminal 117. The collectors of the two input transistors 112 and 113 are connected in common to the connection line to which the high level power supply terminal 116 is coupled.

The two output terminals 107 and 108 of the current switch circuit are connected to the two input terminals 110 and 111 of the emitter follower circuit via two interconnects (wirings) 118 and 119, respectively. The two interconnects 118 and 119 connect the collectors of the two drive transistors 103 and 104 and the bases of the two input transistors 112 and 113 via the two output terminals 107 and 108 of the current switch circuit and the two input terminals 110 and 111 of the emitter follower circuit.

In this ECL circuit, a matching between an output impedance of the current switch circuit and a characteristic impedance of the interconnect 118 and 110 is taken so that an eye opening ratio which represents a rate of an amplitude size of an eye pattern of a data signal propagating the interconnect 118 and 110 to the amplitude size of the eye pattern of the data signal input to the output terminal 107 of the current switch circuit, may be larger than a predetermined value.

The impedance matching conditions will be described in detail.

Now, assuming that an output impedance of the current switch circuit, an input impedance of the emitter follower circuit, a characteristic impedance of the interconnect and an eye opening ratio of a data signal (pulse signal) propagating the interconnect are R1, R2, Z0 and M, respectively, it is found from various experimental results up to this time that when these values satisfy at least one of the following formulas in a frequency range (the order of GHz or up to about a GHz level) of the data signal propagating the interconnect, $$\left| \frac{Z_0}{Z_0 + R_1} \left[ 1 + \frac{R_2 - Z_0}{R_2 + Z_0} \right] - \frac{R_2}{R_1 + R_2} \right| < \frac{1 - M}{2} \quad (1)$$

and $$\left| \frac{Z_0}{Z_0 + R_1} \left[ 1 + \frac{R_2 - Z_0}{R_2 + Z_0} \right] \left[ 1 + \frac{R_2 - Z_0}{R_2 + Z_0} * \frac{R_2 - Z_0}{R_1 + R_2} \right] - \frac{R_2}{R_1 + R_2} \right| < \frac{1 - M}{2} \quad (2)$$

the matching between the characteristic impedance of the interconnect and at least one of the output impedance of the current switch circuit and the input impedance of the emitter follower circuit can be made. By satisfying at least one of the formula (1) or the formula (2), mainly restrict the size of overshoot and undershoot, respectively, caused by the reflection, of the data signal waveform.

Hereinafter, an explanation will be given a case of the matching between the characteristic impedance of the interconnect and the output impedance of the current switch circuit so as to satisfy the above-mentioned formulas (1) and (2) in detail.

Figure 8:
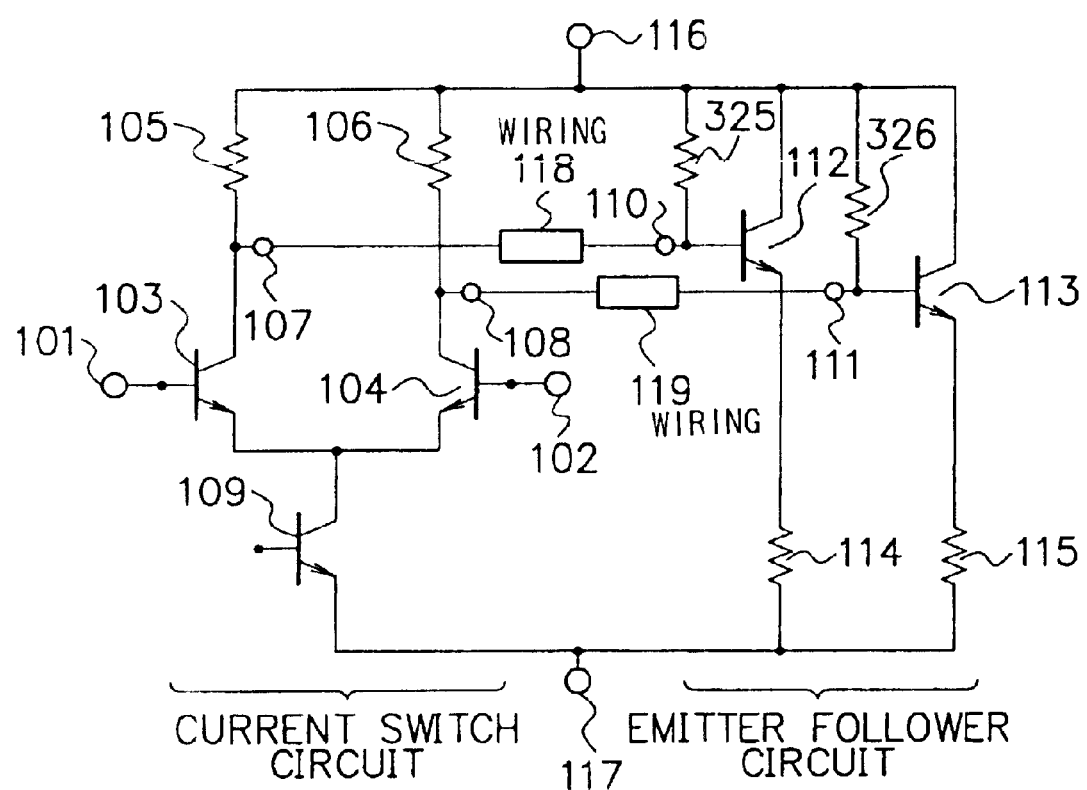
FIG. 8 is a graphical representation for explaining principles of the emitter coupled logic circuit shown in FIG. 7.

In FIG. 8, there is shown an output characteristic such as relationship between an output impedance and a frequency at the output terminals 107 and 108 of the current switch circuit of the ECL circuit shown in FIG. 7. In this embodiment, the load resistors 105 and 106 having a resistance value of 30 Ω are used in the current switch circuit and the output impedance R1 of the current switch circuit is 30 Ω+j0 Ω~27 Ω−j7 Ω((30+j0)Ω~(27−j7)Ω) in the frequency range from DC to 100 GHz.

Figure 9:
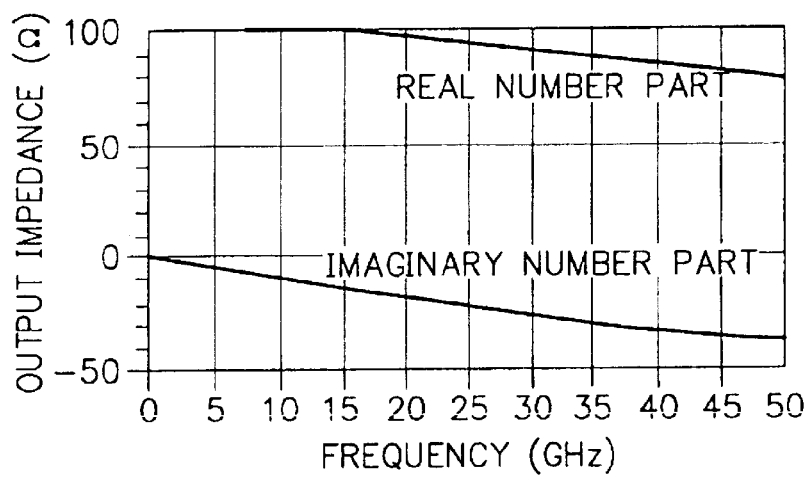
FIG. 9 is a cross sectional view showing a structure of interconnect for coupling a current switch circuit and an emitter follower circuit of the emitter coupled logic circuit shown in FIG. 7.

In FIG. 9, there is shown a structure of the interconnects 118 and 119 for connecting the current switch circuit and the emitter follower circuit of the ECL circuit shown in FIG. 7. In this interconnect structure, the interconnects 118 and 119 as the second interconnecting layer (strip line) having a thickness of 1 μm and a width of 4 μm are formed on an ground 120 as the first interconnecting layer (flat conductor plate) via an interlayer insulating film 121 of $SiO_2$ having a thickness of 1 μm. This interconnect structure is a micro strip line interconnect and its characteristic impedance $Z_0$ is approximately 28 Ω.

Now, it is estimated whether or not the formulas (1) and (2) are satisfied as follows. First, assuming that the eye opening ratio M necessary for the pulse signal propagating the interconnect is 0.8, both the right sides of the formulas (1) and (2) become 0.1. Further, assuming that the input impedance $R_2$ of the emitter follower circuit at its input terminals 110 and 111 is infinite for simplifying the calculation, the formula (1) becomes as follows.

$$\left| \frac{2*Z_0}{Z_0 + R_1} - 1 \right| < 0.1 \tag{3}$$

In the same manner, the formula (2) becomes as follows.

$$\left| \frac{2*Z_0}{Z_0 + R_1} \left[ 1 + \frac{R_1 - Z_0}{R_1 + Z_0} \right] - 1 \right| < 0.1 \tag{4}$$

Since the characteristic impedance $Z_0$ of the interconnect 118 and 119 is 28 Ω, the real number part of the left side of the formula (3) becomes 0.034~0.018 and the condition of the formula (1) is satisfied. In the same way, the real number part of the left side of the formula (4) becomes 0.001~0.0003 and the condition of the formula (2) is satisfied. Hence, the characteristic impedance of the interconnects 118 and 119 matches the output impedance of the current switch circuit. Thus, even when the interconnect length of the interconnects 118 and 119 is long such as 1 mm, no gain peaking occurs in the frequency characteristic and no distortion arises in the data signal. Hence, the amplitude and the propagation of the data signal can be correctly carried out.

However, in this embodiment, the characteristic impedance of the interconnects 118 and 119 still does not match the input impedance of the emitter follower circuit at its input terminals 110 and 111.

Different from a conventional matching using a microwave, which requires no consideration of a matching of a characteristic impedance of interconnect, when the frequency rises to the order of GHz, it is necessary to consider the matching of the characteristic impedance of the interconnect. In this case, by making at least one of the following matchings, (1) matching of the interconnect with its front stage circuit;

(2) matching of the interconnect with its rear stage circuit; and (3) matching of the interconnect with its front and rear stage circuits, the amplitude and the propagation of the data signal can be correctly performed. Hence, by using the aforementioned formulas (1) and (2), it is possible to make matching between the characteristic impedance of the interconnect and the input impedance of the emitter follower circuit, and further matching between the characteristic impedance of the interconnect and both the output impedance of the current switch circuit and the input impedance of the emitter follower circuit can be conducted.

Figure 10:
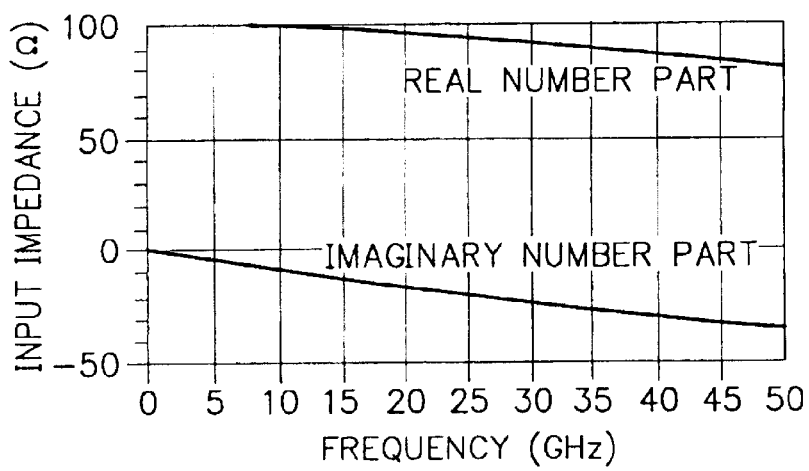
FIG. 10 is a cross sectional view showing a construction of the emitter coupled logic circuit shown in FIG. 7.

In the following, method for manufacturing a semiconductor integrated circuit according to the present invention will be described in detail. The semiconductor integrated circuit of the present invention can be manufactured by using a conventional manufacturing process. FIG. 10 is a cross sectional view showing a construction of the semiconductor integrated circuit of the emitter coupled logic circuit shown in FIG. 7.

First, on a semi-insulating substrate 122 of GaAs, a subcollector layer 123, a collector layer 124, a base layer 125 and an emitter layer 126 are successively formed in this order. Then, each of an emitter electrode 127, a base electrode 128 and a collector electrode 129 of transistors are formed by using a lithography using a photo-resist film, an etching and an ohmic electrode formation technique. In this embodiment, as shown in FIG. 10, the drive transistor 103 or 104 is separated from the input transistor 112 or 113 by an isolation 130.

Then, after an interlayer insulating film ($SiO_2$) is deposited on the entire surface to make a flat surface of each element, the interlayer insulating film ($SiO_2$) is deposited thereon again. After forming contact holes on the electrodes of the transistors 103 (104) and 112 (113), for example, a Ti/Pt/Au layer as a first interconnecting layer is formed by a sputtering method and an ion milling method. This first interconnecting layer is the ground 120 shown in FIG. 9. While this first interconnecting layer is formed, a resistor 131 is also formed. This resistor 131 is the resistor 105 or 106 shown in FIG. 7.

Further, the interlayer insulating film ($SiO_2$) is deposited again in thickness of 1 μm and thereafter a second interconnecting layer of the Ti/Pt/Au layer or an Au layer is formed in the same manner as the first interconnecting layer or by an Au plating method. This second interconnecting layer is the interconnect 118 or 119 shown in FIG. 7 and the interlayer insulating film deposited in thickness of 1 μm is the interlayer insulating film 121 shown in FIG. 9. The width and the thickness of the micro strip line are determined so that the characteristic impedance of the interconnect may match the output impedance of the current switch circuit, the input impedance of the emitter follower circuit, or both the output impedance of the current switch circuit and the input impedance of the emitter follower circuit. Preferably, the width and the thickness of the micro strip line are determined so that at least one of the two formulas (1) and (2) may be satisfied.

In the above-described producing process, a semiconductor integrated circuit having a monolithic structure (interconnects and circuits are formed on a same semiconductor substrate) including the micro strip line interconnect shown in FIG. 9 can be produced.

In this embodiment, although the ECL circuit using the bipolar transistors has been described, the same effects and advantages can be obtained in an integrated circuit using other devices such as field effect transistors (FETs) of GaAs and/or MOS (metal oxide semiconductor) transistors.

Second Embodiment

Figure 11:
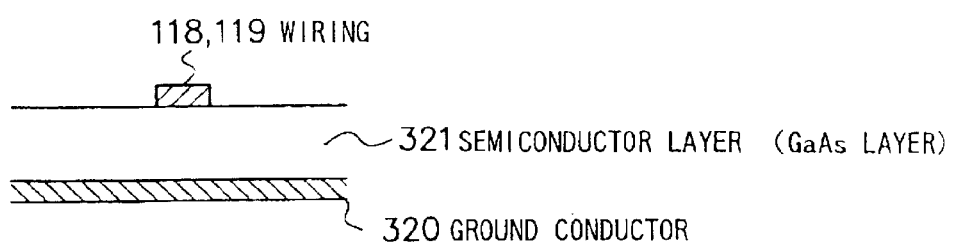
FIG. 11 is a circuit diagram showing a configuration an emitter coupled logic circuit of a semiconductor integrated circuit according to the second embodiment of the present invention.

In FIG. 11, there is shown a semiconductor integrated circuit having an ECL circuit structure according to a second embodiment of the present invention. This ECL circuit includes a current switch circuit and an emitter follower circuit.

The current switch circuit includes a pair of drive transistors 203 and 204 and a constant current source transistor 209. More specifically, the emitters of the drive transistors 203 and 204 are connected in common to the collector of the constant current transistor 209. Two input terminals 201 and 202 are connected to the bases of the drive transistors 203 and 204, respectively, and two output terminals 207 and 208 are linked to the collectors of the drive transistors 203 and 204, respectively.

The emitter follower circuit includes a pair of input transistors 212 and 213 and a pair of load resistors 214 and 215. That is, two input terminals 210 and 211 are coupled with the bases of the input transistors 212 and 213, respectively. The collectors of the two input transistors 212 and 213 are connected to their own bases via two load resistors 205 and 206, respectively. Further, the collectors of the two input transistors 212 and 213 are connected in common to a connection line coupled to a high level power supply terminal 216. The emitters of the two input transistors 212 and 213 are commonly linked to the emitter of the constant current transistor 209 via the respective load resistors 214 and 215 and a connection line and this connection line is coupled to a low level power supply terminal 217. The two load resistors 205 and 206 are the load resistors of the current switch circuit.

In this embodiment, the two output terminals 207 and 208 of the current switch circuit are coupled with the two input terminals 210 and 211 of the emitter follower circuits via the interconnects 218 and 219, respectively. That is, the current switch circuit and the emitter follower circuit are connected by the interconnects 218 and 219 arranged between the two drive transistors 203 and 204 and the two load resistors 205 and 206 of the current switch circuit.

In this ECL circuit, a matching is made between a characteristic impedance of the interconnects 218 and 219 and an input impedance of the emitter follower circuit so that an eye opening ratio may be larger than a predetermined value.

Now, an impedance matching between the interconnects 218 and 219 and the emitter follower circuit so as to satisfy the above-mentioned formulas (1) and (2) will be described in detail.

Figure 12:
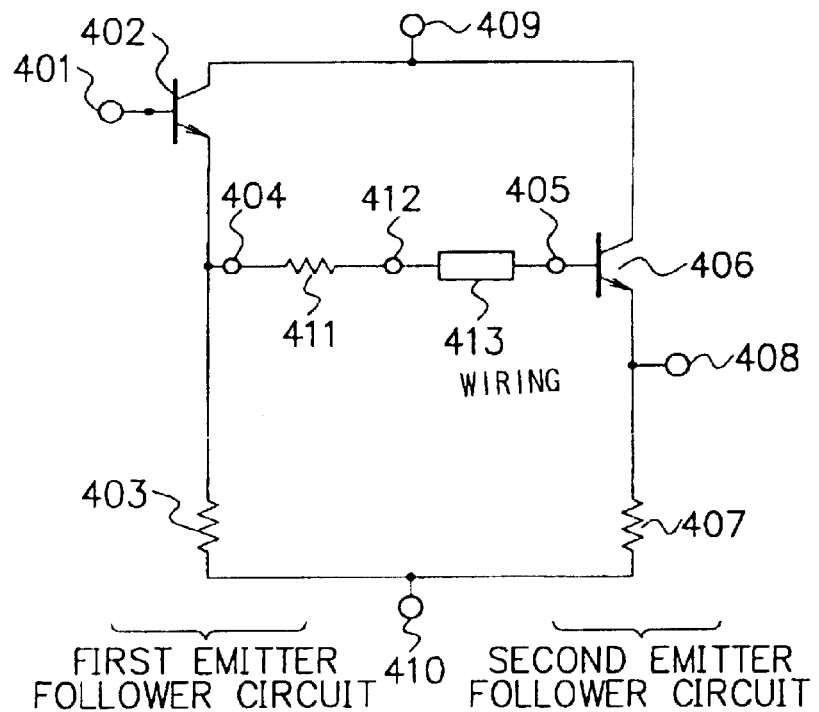
FIG. 12 is a graphical representation for explaining of principle showing an input impedance of an emitter follower circuit of the emitter coupled logic circuit shown in FIG. 11.

The load resistors 205 and 206 of the current switch circuit are directly connected to the input transistors 212 and 213 of the emitter follower circuit different from the first embodiment described above. FIG. 12 illustrates the input impedance at the input terminals 210 and 211 of the emitter follower circuit. In this embodiment, the load resistors 205 and 206 having a resistance value of 40 Ω are used and the input impedance $R_2$ at the input terminals 210 and 211 of the emitter follower circuit is 40 Ω+j0 Ω~35 Ω−j15 Ω in the frequency range from DC to 80 GHz.

Figure 13:
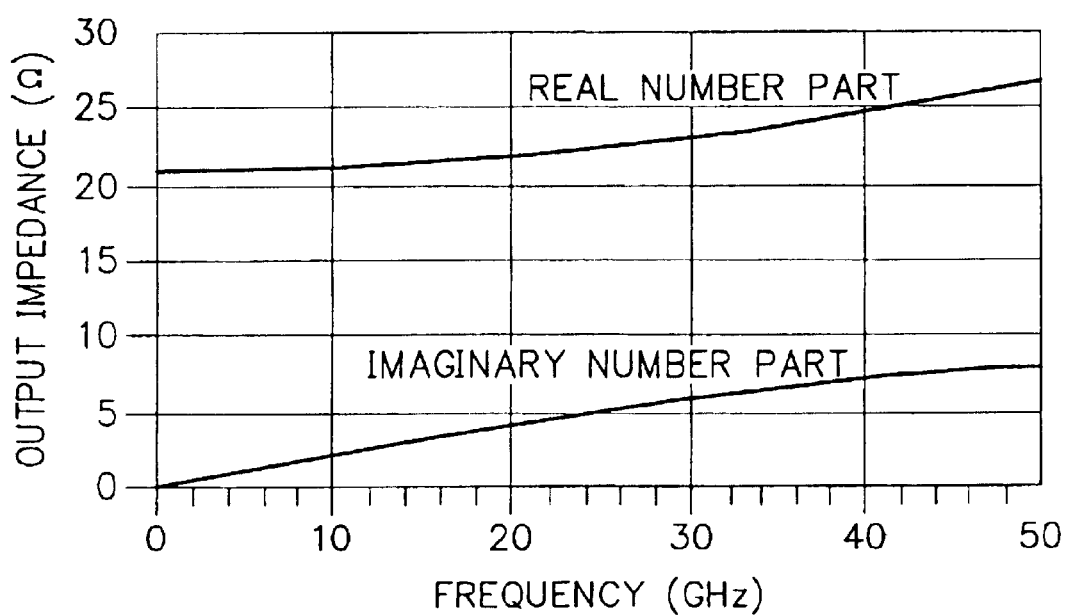
FIG. 13 is a cross sectional view showing a structure of interconnect for coupling drive transistors with load resistors of a current switch circuit in the emitter coupled logic circuit shown in FIG. 11.

In FIG. 13, there is shown a structure of the interconnects 218 and 219 for connecting the drive transistors 203 and 204 and the load resistors 205 and 206 of the current switch circuit. In this interconnect structure, the interconnects 218 and 219 as the second interconnecting layer (strip line) having a thickness of 1 μm and a width of 4 μm are formed on an ground 220 as the first interconnecting layer (flat conductor plate) via an interlayer insulating film 221 of $SiO_2$ having a thickness of 1.5 μm. This interconnect structure is a micro strip line interconnect and its characteristic impedance $Z_0$ is approximately 38 Ω.

Now, it is estimated whether or not the formulas (1) and (2) are satisfied in the same manner as the aforementioned first embodiment wherein it is assumed that the necessary eye opening ratio M for the pulse signal propagating the interconnect is 0.8. Now, it is assumed that the output impedance $R_1$ at the output terminals 207 and 208 of the current switch circuit is 30000 Ω−j20000 Ω~34 Ω−j50 Ω in the frequency range from DC (0 GHz) to 80 GHz. Since both the right sides of the formulas (1) and (2) are 0.1, the real number part of the left side of the formula (1) becomes 0~0.001 and the real number part of the left side of the formula (2) becomes 0~0 (nearly equal 0). As a result, the conditions of the formulas (1) and (2) are satisfied. Hence, the characteristic impedance of the interconnects 218 and 219 matches the input impedance of the emitter follower circuit. Thus, even when the interconnect length of the interconnects 218 and 219 is as long as 500 μm, no gain peaking occurs in the frequency characteristic and no distortion arises in the data signal. Hence, the amplitude and the propagation in the data signal can be correctly performed.

In this embodiment, the characteristic impedance of the interconnects 218 and 219 still mismatches the output impedance of the current switch circuit at its output terminals 207 and 208.

Although the matching is made between the characteristic impedance of the interconnect and the input impedance of the emitter follower circuit has been described in this embodiment by using the aforementioned formulas (1) and (2), the matching between the characteristic impedance of the interconnect and the output impedance of the current switch circuit and further the matching between the characteristic impedance of the interconnect and both the output impedance of the current switch circuit and the input impedance of the emitter follower circuit maybe matched.

The ECL circuit of this embodiment can be produced by using almost the same manufacturing process as the first embodiment described above and the width and the thickness of the micro strip line of the interconnect can be suitably determined so that at least one of the formulas (1) and (2) may be satisfied.

Third Embodiment

In this embodiment, although the ECL circuit using the bipolar transistors has been described, the same effects and advantages can be obtained in an integrated circuit using other devices such as the field effect transistors (FETs) of GaAs and the MOS transistors.

Figure 14:
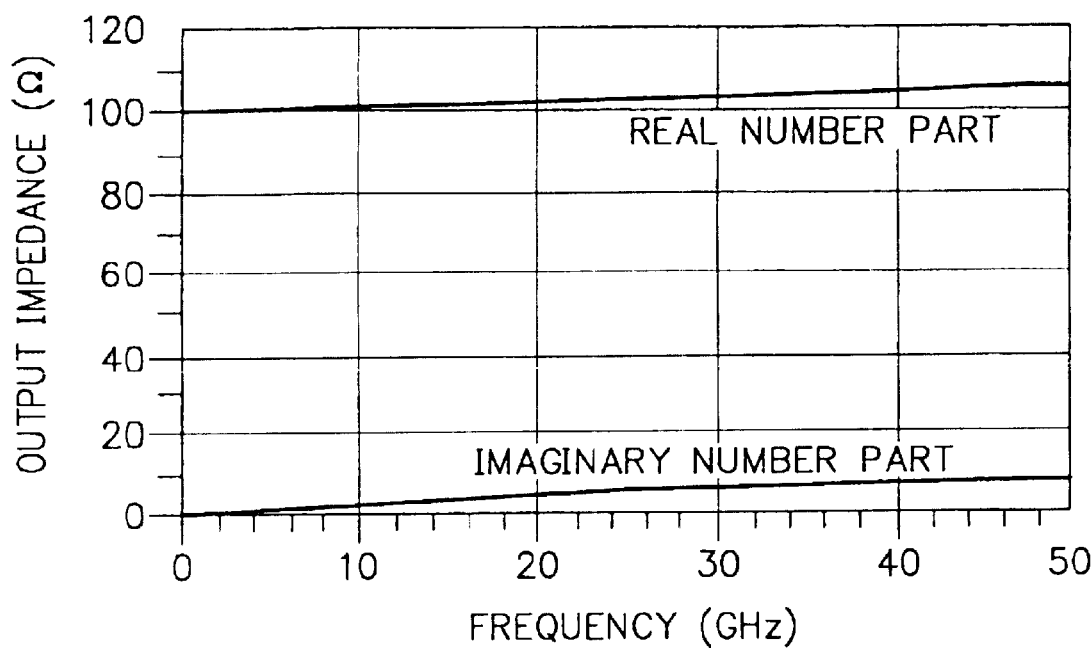
FIG. 14 is a circuit diagram showing a configuration an emitter coupled logic circuit in a semiconductor integrated circuit according to the third embodiment of the present invention.

In FIG. 14, there is shown a semiconductor integrated circuit having an ECL circuit structure according to a third embodiment of the present invention. This ECL circuit further includes a pair of load resistors 325 and 326 of the current switch circuit besides the ECL circuit shown in FIG. 7. In FIG. 14, the same members as those shown in FIG. 7 are designated by the same numerals and thus the description thereof can be omitted.

In this ECL circuit, one ends of the two load resistors 325 and 326 are connected to the bases of the respective input transistors 112 and 113 of the emitter follower circuit and also to the respective input terminals 110 and 111 and the other ends of the two load resistors 325 and 326 are connected in common to the connection line to which the high level power supply terminal 116 is coupled.

In this ECL circuit, a matching between a characteristic impedance of the interconnects 118 and 119 and an input impedance of the emitter follower circuit and a matching between the characteristic impedance of the interconnects 118 and 119 and an output impedance of an emitter follower circuit are executed so that an eye opening ratio may be larger than a predetermined value.

Now, there will be explained in the case of impedance matchings between the interconnects 118 and 119 and the current switch circuit and between the interconnects 118 and 119 and the emitter follower circuit so as to satisfy the above-mentioned formulas (1) and (2) will be described in detail.

Figure 15:
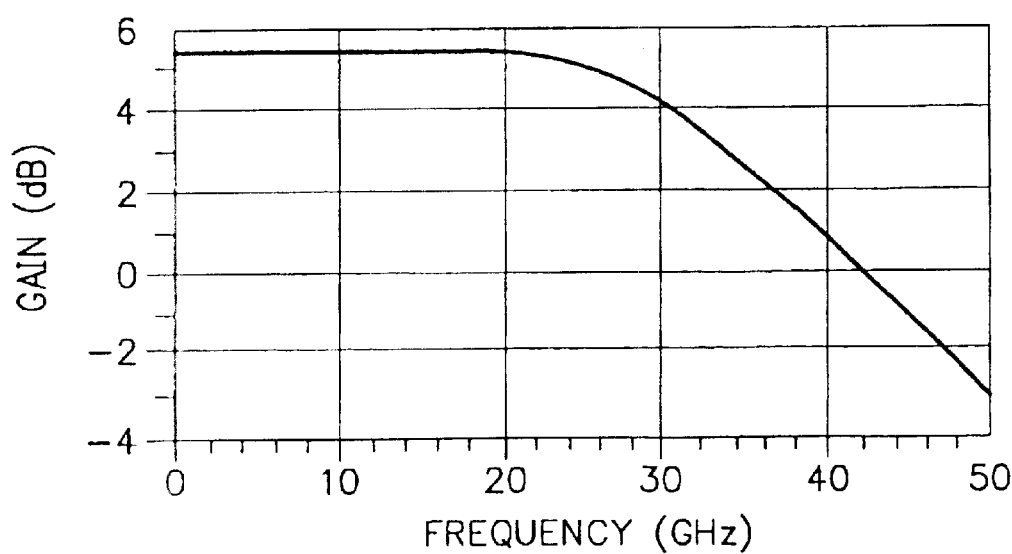
FIG. 15 is a graphical representation for explaining principle of an output impedance of a current switch circuit of the emitter coupled logic circuit shown in FIG. 14.

The load resistance value of the current switch circuit is determined by a parallel circuit of the resistors 105, 106, 325 and 326. In this case, the resistors 105, 106, 325, and 326 having a resistance value of 100 Ω are used in the current switch circuit and the load resistance value becomes 50 Ω. FIG. 15 illustrates an input impedance of the current switch circuit on the input side of the interconnects 118 and 119 for connecting the current switch circuit and the emitter follower circuit of the ECL circuit shown in FIG. 14. In this embodiment, the output impedance R1 of the current switch circuit is 100 Ω+j0 Ω~80 Ω−j38 Ω in the frequency range from DC to 50 GHz.

FIG. 16 illustrates an input impedance of the emitter follower circuit on the output side of the interconnects 118 and 119 for connecting the current switch circuit and the emitter follower circuit of the ECL circuit shown in FIG. 14. In this embodiment, the resistors 325 and 326 as a part of the whole load resistors of the current switch circuit are directly connected to the input transistors 112 and 113 of the emitter follower circuit in the same manner as the second embodiment described above, and the input impedance R2 of the emitter follower circuit is 100 Ω+j0 Ω~81 Ω−j35 Ω in the frequency range from DC to 50 GHz.

Figure 17:
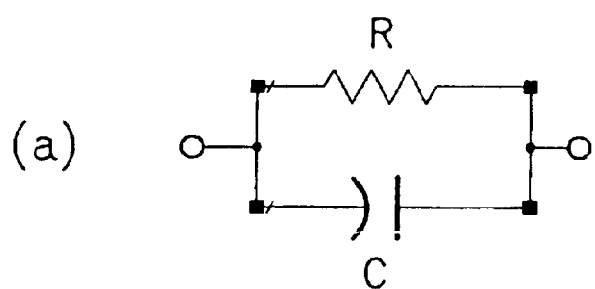
FIG. 17 is a cross sectional view showing a structure of interconnect for coupling a current switch circuit with an emitter follower circuit of the emitter coupled logic circuit shown in FIG. 14.
Figure 17:
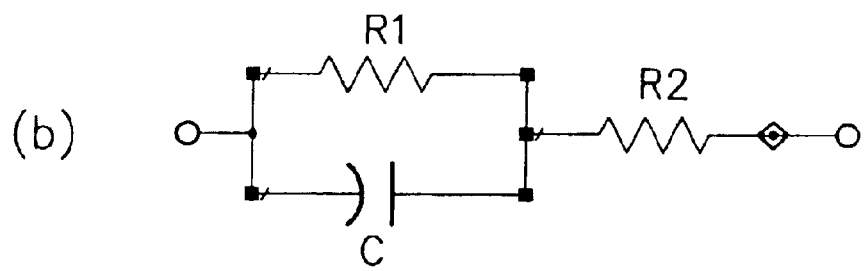
Figure 17:
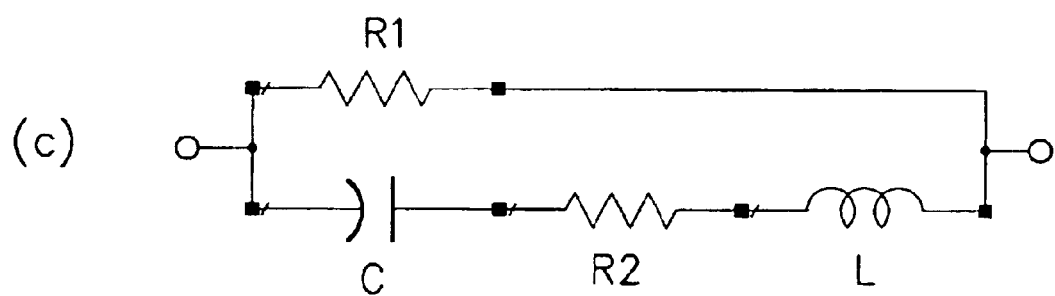

In FIG. 17, there is shown a structure of the interconnects 118 and 119 for connecting the current switch circuit and the emitter follower circuit. In this interconnect structure, the interconnects (strip line) 118 and 119 of Au having a thickness of 1 μm and a width of 6 μm are formed on an ground 320 as the first interconnecting layer (flat conductor plate) via a semiconductor layer 321 of GaAs having a thickness of 80 μm. This interconnect structure is a micro strip line interconnect and its characteristic impedance $Z_0$ is approximately 100 Ω.

Now, it is estimated whether or not the formulas (1) and (2) are satisfied in the same manner as the aforementioned first embodiment wherein it is assumed that the necessary eye opening ratio M for the pulse signal propagating the interconnect is 0.8. Since both the right sides of the formulas (1) and (2) are 0.1, the real number part of the left side of the formula (1) becomes 0~0.006 and the real number part of the left side of the formula (2) becomes 0~0. As a result, both the conditions of the formulas (1) and (2) are satisfied. Hence, in this embodiment, the characteristic impedance of the interconnects 118 and 119 matches both the output impedance of the current switch circuit and the input impedance of the emitter follower circuit. Thus, even when the interconnect length of the interconnects 118 and 119 is long such as 1 mm, unwanted gain peaking does not occurs in the frequency characteristic and no distortion arises in the data signal. Hence, the amplitude and the propagation of the data signal can be correctly carries out.

The ECL circuit of this embodiment can be produced by using almost the same producing process as the first embodiment described above and the width and the thickness of the micro strip line of the interconnect can be suitably determined so that both the formulas (1) and (2) may be satisfied.

In this embodiment, although the ECL circuit using the bipolar transistors has been described, the same effects and advantages can be obtained in an integrated circuit using other devices such as the field effect transistors (FETs) of GaAs and the MOS transistors.

Fourth Embodiment

Figure 18:
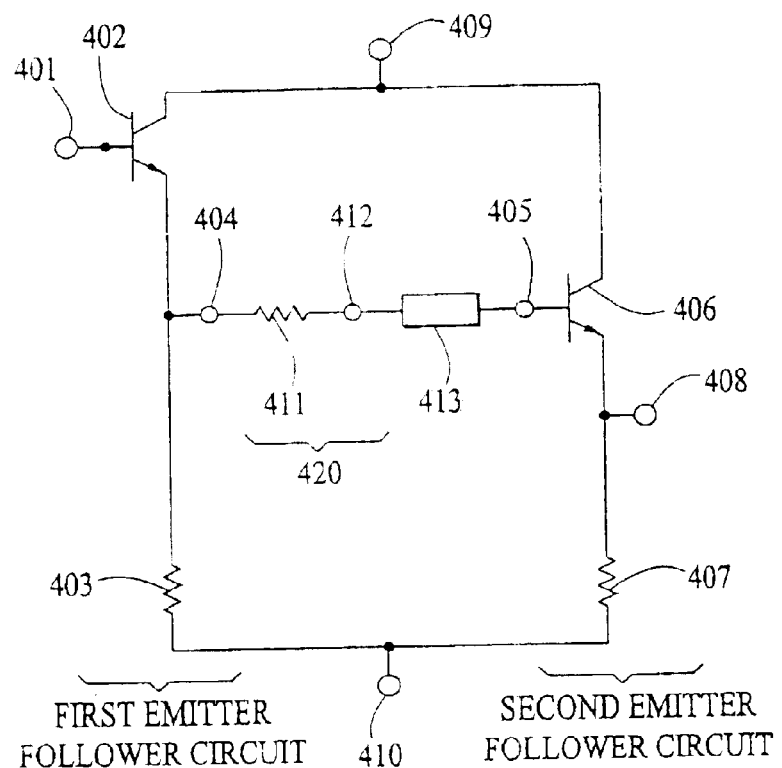
FIG. 18 is a circuit diagram showing a configuration of a semiconductor integrated circuit according to the fourth embodiment of the present invention.

In FIG. 18, there is shown a semiconductor integrated circuit according to a fourth embodiment of the present invention. The semiconductor integrated circuit includes a first emitter follower circuit and a second emitter follower circuit and further includes an impedance converter circuit using a resistor is placed at the output of the first emitter follower circuit.

In this embodiment, the first emitter follower circuit includes an input transistor 402 and a load resistor 403 and the second emitter follower circuit includes an input transistor 406 and a load resistor 407. More specifically, in the first emitter follower circuit, an input terminal 401 is connected to the base of the input transistor 402 and an output terminal 404 is connected to a connection line connecting the emitter of the input transistor 402 and the load resistor 403. In the second emitter follower circuit, an input terminal 405 is connected to the base of the input transistor 406 and an output terminal 408 is connected to a connection line connecting the emitter of the input transistor 406 and the load resistor 407. The collectors of the input transistors 402 and 406 are connected in common to a connection line coupled to a high level power supply terminal 409, and the emitters of the input transistors 402 and 406 are linked in common to a connection line via the respective load resistors 403 and 407 and this connection line is coupled to a low level power supply terminal 410.

The impedance converter circuit 420 includes a resistor a resistor 411. One of the resistor 411 is connected to the output terminal of the first emitter follower circuit and the other end of the resistor 411 is coupled with an output terminal 412 of the impedance converter circuit 420. This output terminal 412 of the impedance converter circuit 420 is linked to the input terminal 405 of the second emitter follower circuit via a interconnect 413 for coupling the first and the second emitter follower circuits.

In this semiconductor integrated circuit, a matching is made between a characteristic impedance of the interconnect 413 and an output impedance, converted by the impedance converter circuit 420, of the first emitter follower circuit so that an eye opening ratio may be larger than a predetermined value by the impedance converter circuit 420, of the first emitter follower circuit so that an eye opening ratio may be larger than a predetermined value.

Then, there will be explained a case where a matching will be made between a characteristic impedance of the interconnect 413 and an output impedance, converted by the impedance converter circuit 420, of the first emitter follower circuit so as to satisfy the above-mentioned formulas (1) and (2) in detail. In this case, it is assumed that the output impedance, converted by the impedance converter circuit 420, of the first emitter follower circuit is $R_1$.

Figure 3:
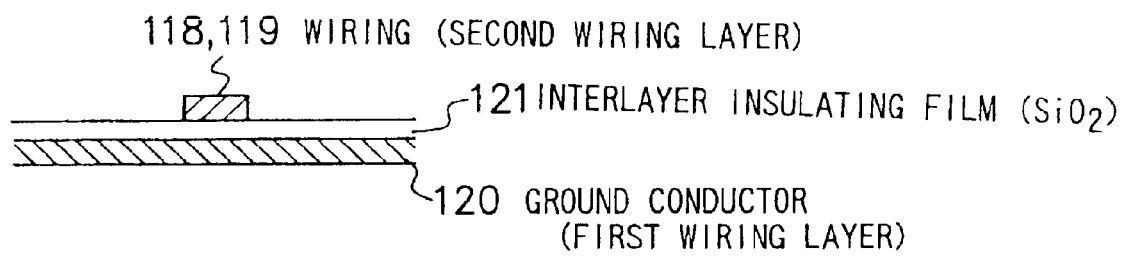
FIG. 3 is a cross sectional diagram showing a structure of interconnect for coupling two emitter follower circuits of the conventional two-stage emitter coupled logic circuit shown in FIG. 2.

The interconnect 413 for coupling the first and the second emitter follower circuits has the same interconnect structure as the semiconductor substrate shown in FIG. 3. That is, the interconnect 413 of a interconnecting layer of Au having a thickness of 1 μm and a width of 6 μm is formed on an ground 630 via a semiconductor layer 631 of a GaAs layer having a thickness of 120 μm, and its characteristic impedance $Z_0$ is approximately 105 Ω.

Figure 19:
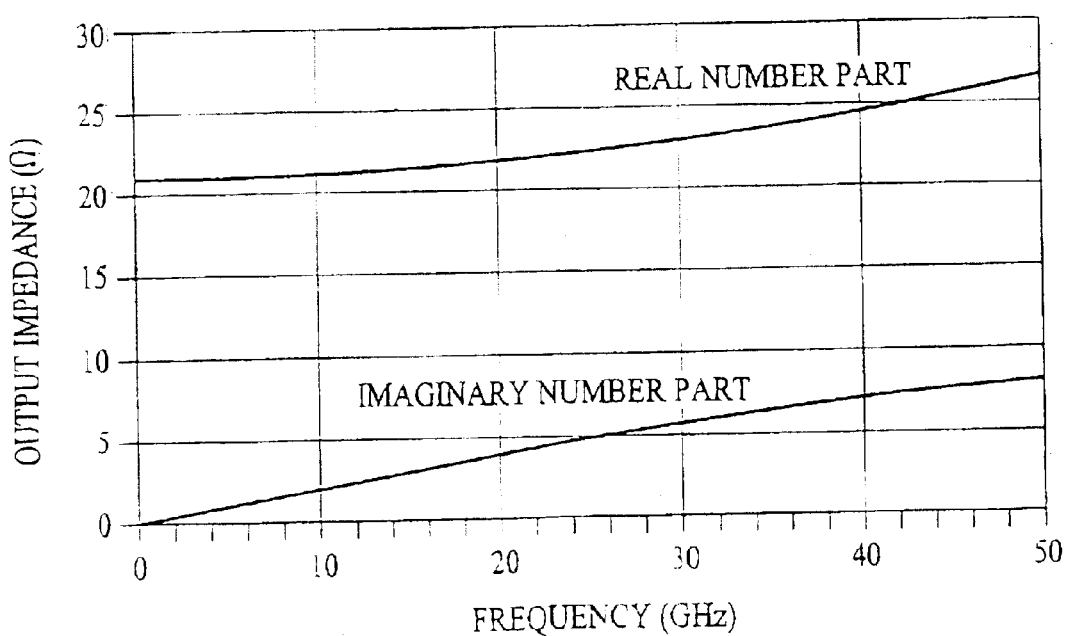
FIG. 19 is a graphical representation for explaining principle of showing an output impedance of the first emitter follower circuit of the semiconductor integrated circuit shown in FIG. 18 at its output terminal.

In FIG. 19, there is shown an output impedance of the first emitter follower circuit at output of the output terminal 404 and frequency. The output impedance of the first emitter follower circuit is 21 Ω+j0 Ω~27 Ω+j8 Ω in the frequency range from DC to 50 GHz.

In this embodiment, when a resistance value of the resistor 411 is 80 Ω in the impedance converter circuit and the output impedance $R_1$ of the first emitter follower circuit at the output terminal 412 of the impedance converter circuit 420 becomes 101 (Ω+j0 Ω~107+j8 Ω in the frequency range from DC to 50 GHz, as shown in FIG. 20. In this way, by coupling the resistor having the resistance value of 80 Ω with the output of the first emitter follower circuit, the output impedance of the first emitter follower circuit is changed Now, it is estimated whether or not the formulas (1) and (2) are satisfied in the same manner as the aforementioned first embodiment wherein it is assumed that the necessary eye opening ratio M for the pulse signal propagating the interconnect is 0.8. Since both the right sides of the formulas (1) and (2) are 0.1, the real number part of the left side of the formula (1) becomes 0.019~0.009 and the real number part of the left side of the formula (2) becomes 0~0. As a result, both the conditions of the formulas (1) and (2) are satisfied. Hence, in this embodiment, the characteristic impedance of the interconnect 413 matches the output impedance of the first emitter follower circuit that the impedance converter circuit 420 is connected to its output. Thus, even when the interconnect length of the interconnect 413 is long such as 500 μm, unwanted gain peaking does not occur in the frequency characteristic and no distortion arises in the data signal. Hence, the amplitude and the propagation of the data signal can be correctly carried out.

In this embodiment, although the semiconductor integrated circuit in which the impedance converter circuit 420 is placed at the output of the first emitter follower circuit has been described, the impedance converter circuit can be placed at the input of the second emitter follower circuit to execute the impedance matching between the interconnect 413 and the second emitter follower circuit in the same manner as described above. In this instance, it is assumed that the input impedance, converted by the impedance converter circuit 420, of the second emitter follower circuit is $R_2$, and the matching between the characteristic impedance of the interconnect 413 and the input impedance, converted by the impedance converter circuit 420, of the second emitter follower circuit is conducted so as to satisfy the aforementioned formulas (3) and (2). Furthermore, when two impedance converter circuits are placed at the output and the input stages of the first and the second emitter follower circuits in the semiconductor integrated circuit, the impedance matching between the interconnect and the first emitter follower circuit and between the interconnect and the second emitter follower circuit can be performed in the same manner as described above.

Figure 1:
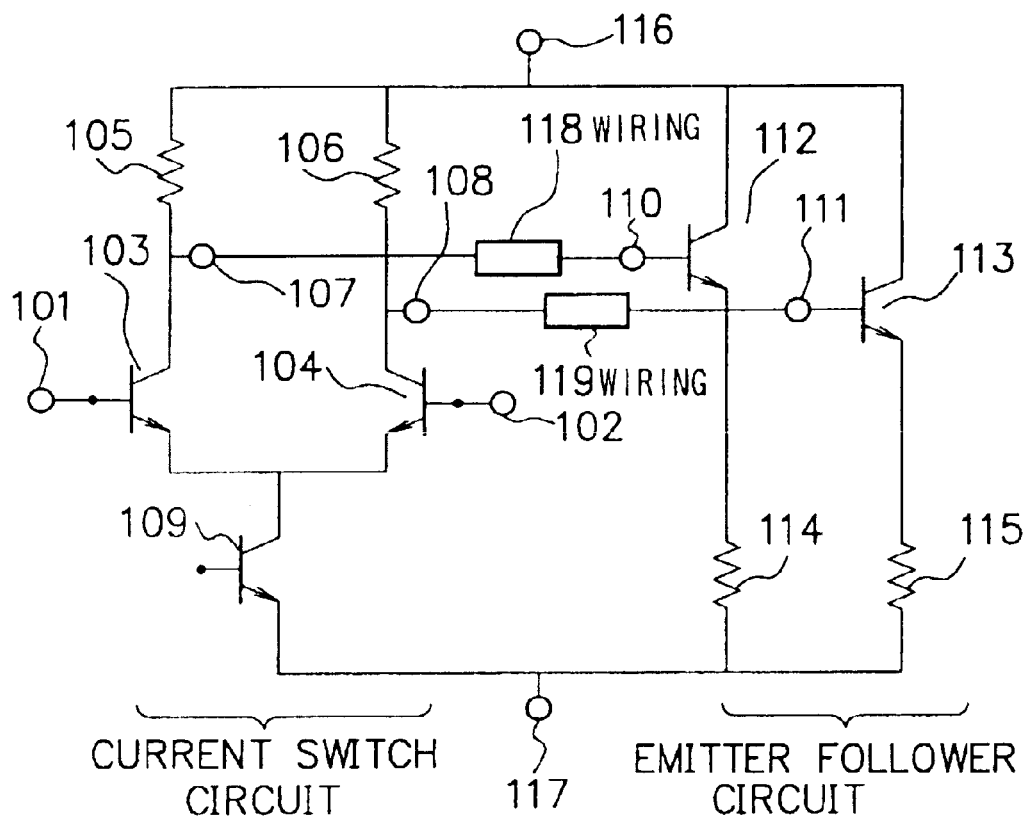
FIG. 1 is a circuit diagram showing a configuration of a conventional emitter coupled logic circuit as a fundamental logic circuit using bipolar transistors.
Figure 2:
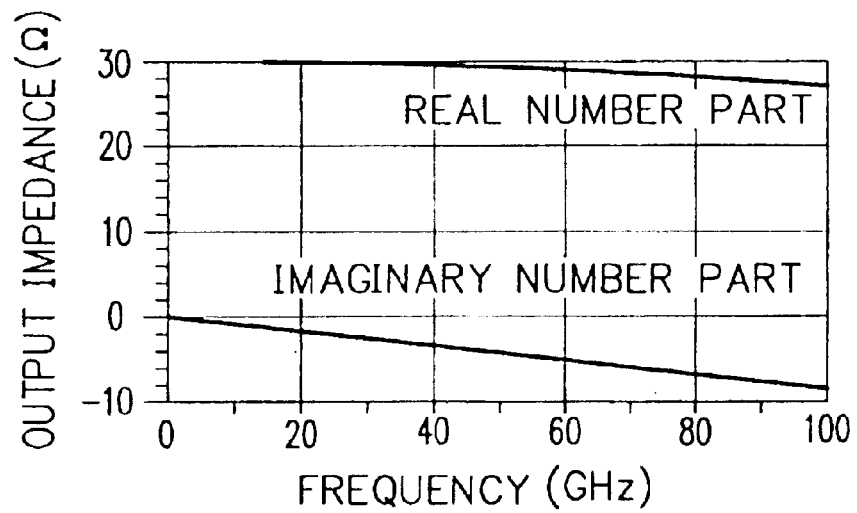
FIG. 2 is a circuit diagram showing a configuration of a conventional two-stage emitter coupled logic circuit.

Then, there will be explanation of the case that the semiconductor integrated circuit of this embodiment is applied to the conventional two-stage ECL circuit shown in FIG. 2.

An impedance converter circuit is placed between the first and the second emitter follower circuits. In this case, two impedance converter circuits are required, that is, a pair of impedance converter circuits are placed just before the pair of interconnects 638 and 639, respectively, for coupling the first and the second emitter follower circuits. A interconnect length of a resistor of each impedance converter circuit is 500 μm.

Figure 4:
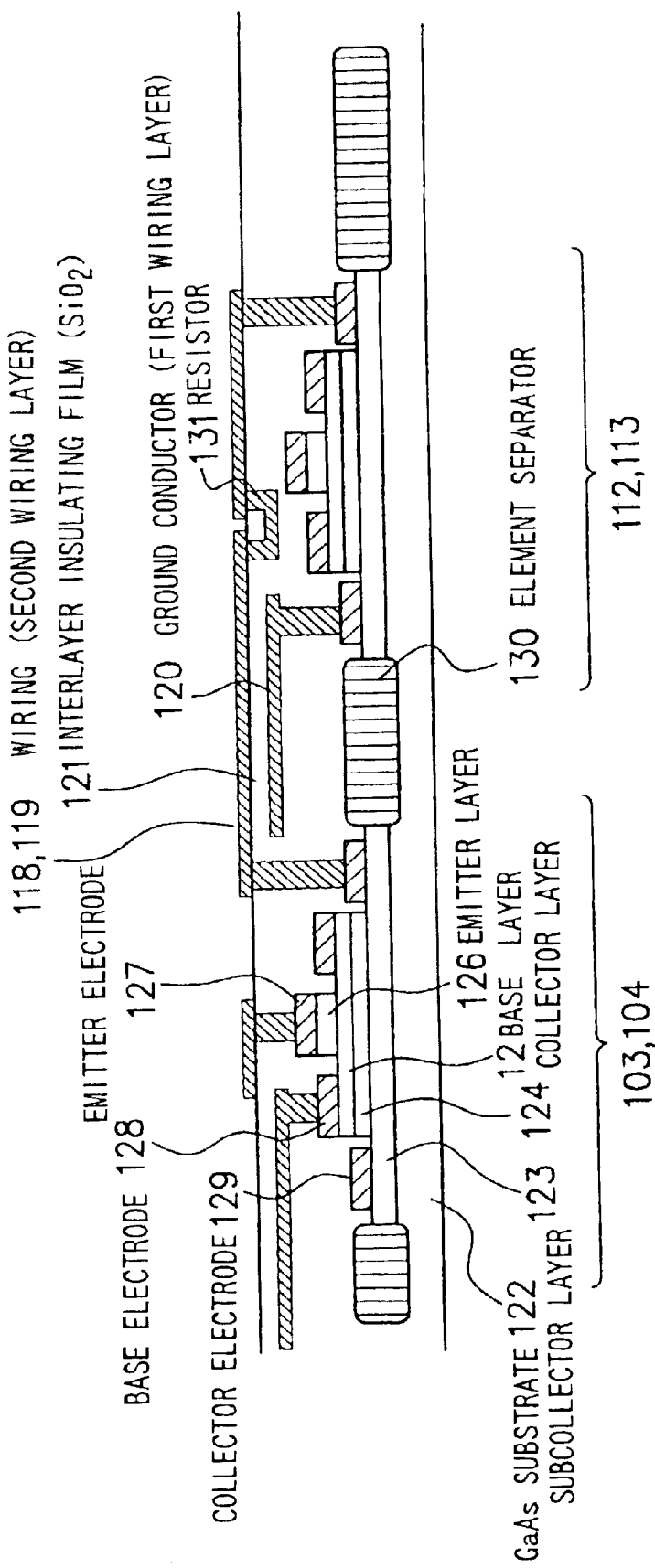
FIG. 4 is a graphical representation showing a frequency characteristic of gain of the conventional two-stage emitter coupled logic circuit shown in FIG. 2.
Figure 5:
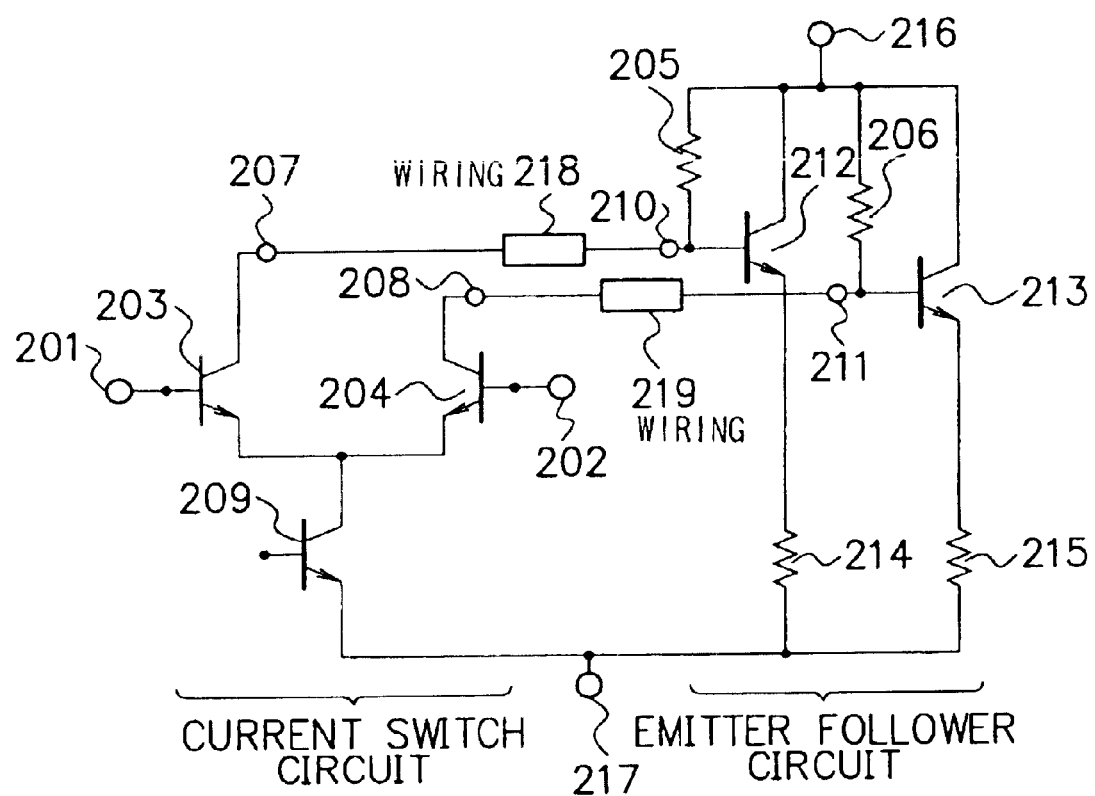
FIG. 5 is a waveform chart showing an example of a waveform of an input data signal of the conventional two-stage emitter coupled logic circuit shown in FIG. 2.
Figure 21:
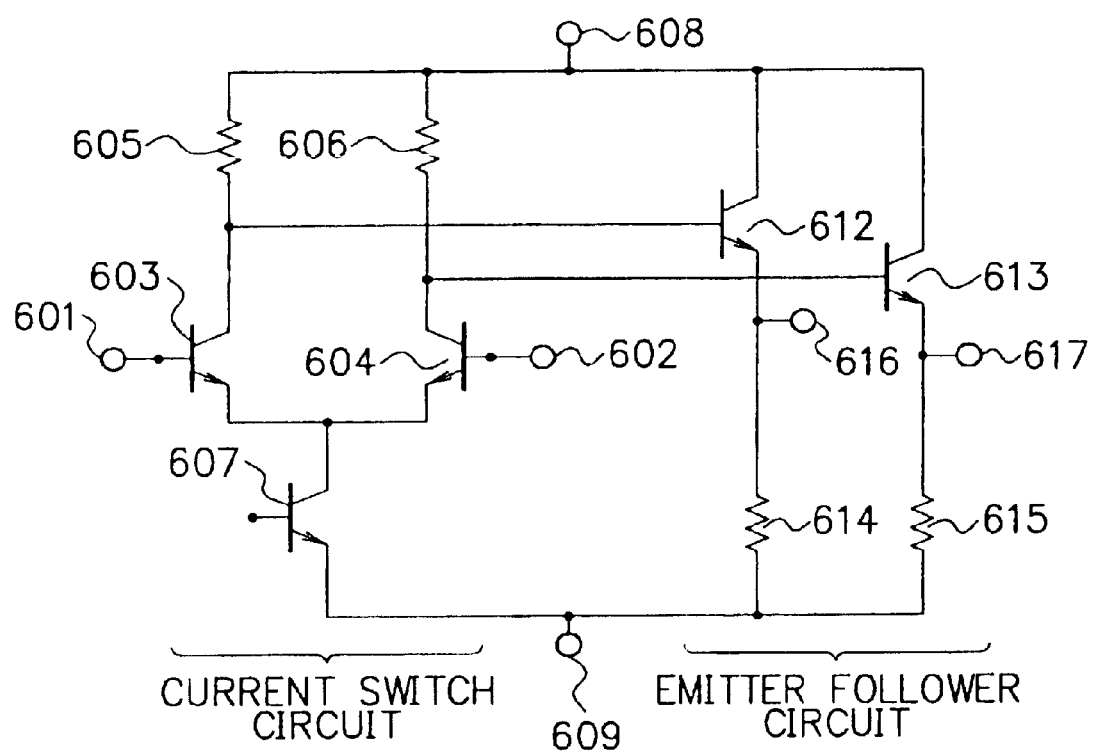
FIG. 21 is a graphical representation showing a frequency characteristic of gain of the two-stage emitter coupled logic circuit shown in FIG. 2, to which the semiconductor integrated circuit shown in FIG. 18 is applied.

In FIG. 21, there is shown a frequency characteristic of gain of the two-stage ECL circuit shown in FIG. 2, to which the semiconductor integrated circuit shown in FIG. 18 is applied. In the frequency-gain characteristic shown in FIG. 21, there is no gain peaking different from the frequency-gain characteristic shown in FIG. 4.

Figure 22:
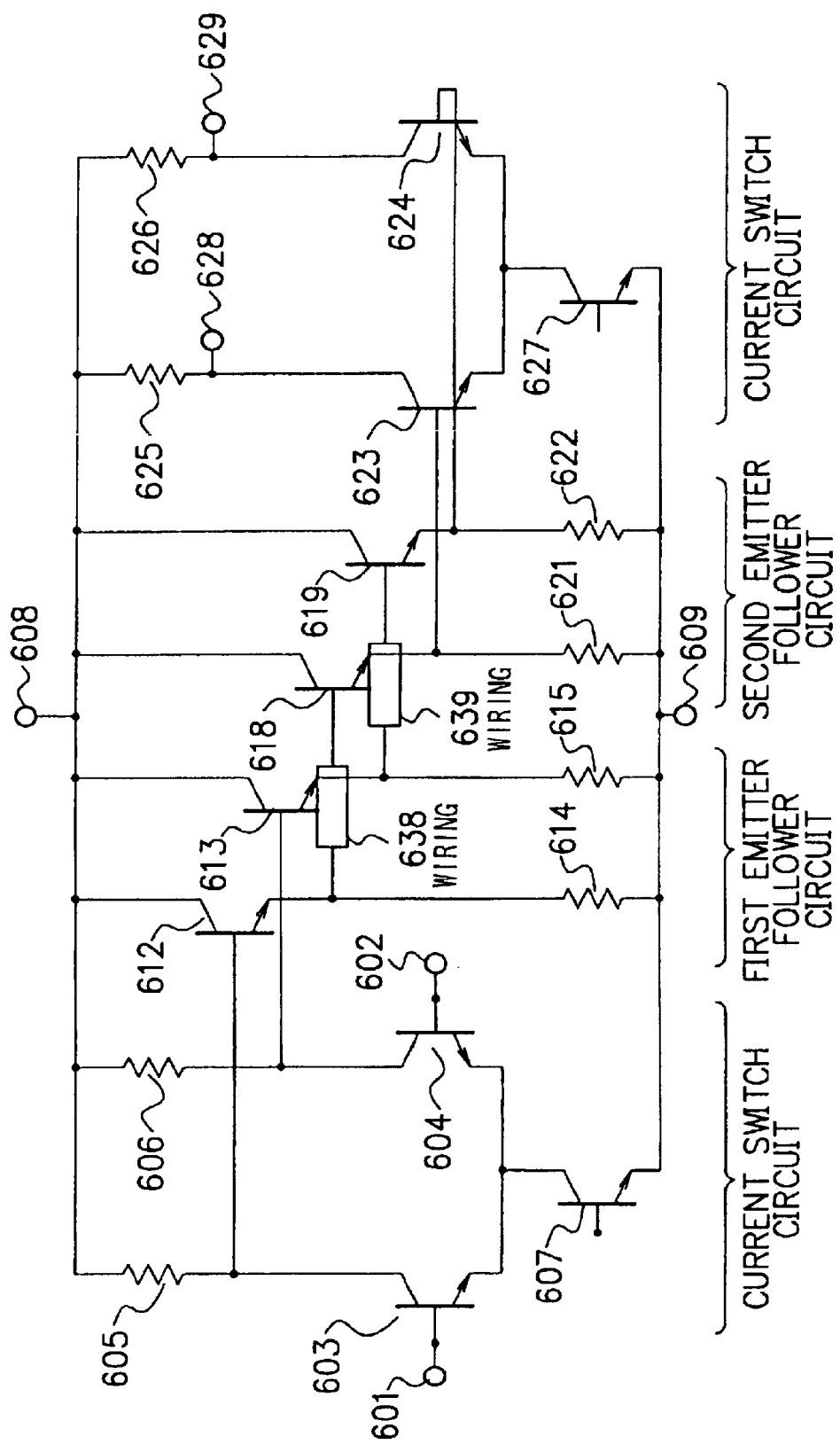
FIG. 22 is a graphical representation showing a waveform of the output data signal of the two-stage emitter coupled logic circuit shown in FIG. 2, to which the semiconductor integrated circuit shown in FIG. 18 is applied.

In FIG. 22, there is shown a waveform of an output data signal of the two-stage ECL circuit when a data signal having a pseudo-random pattern of 20 Gbit/s is input to the two-stage ECL circuit. As apparent from the waveform of the output data signal shown in FIG. 22, the data signal having no error can be propagated.

Figure 23A:
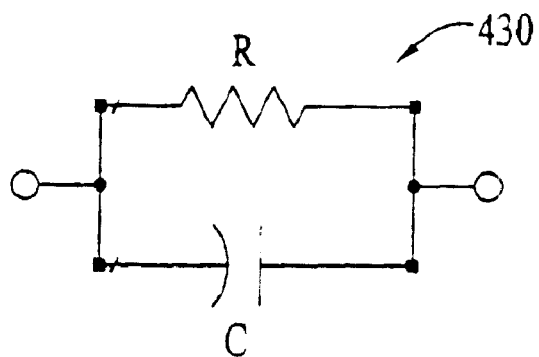
FIGS. 23(a) to 23(c) are circuit diagrams showing variations of the impedance converter circuit of the semiconductor integrated circuit shown in FIG. 18.
Figure 23B:
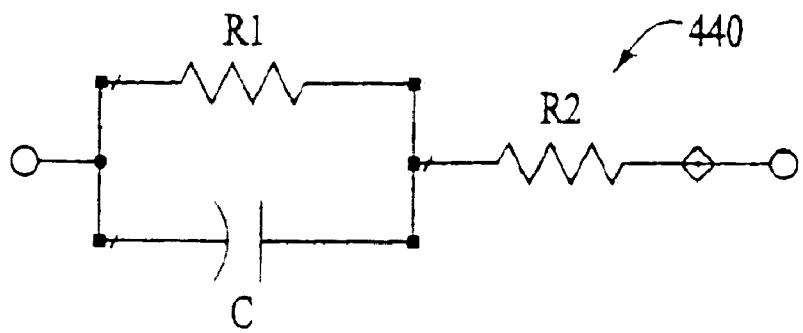
Figure 23C:
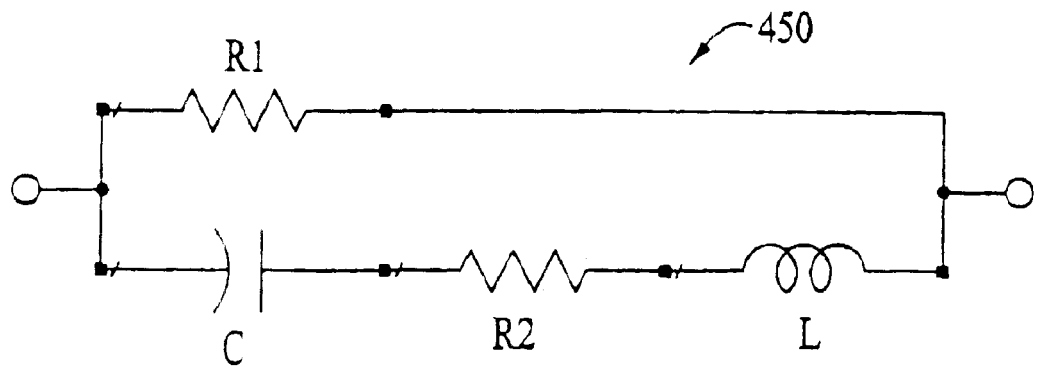

In this embodiment, although the impedance converter circuit using the resistor has been described, however, the present invention is not restricted to this embodiment, and various changed or modified circuits using a capacitor, an inductor and the like can be used. FIGS. 23(a), 23(B) and 23(C) show other impedance converter circuits 430, 440, 450 to be used in the or present invention.

A first impedance converter circuit 430 shown in FIG. 23(A) includes a resistor R and a capacitor C which are connected in parallel. A second impedance converter circuit 440 shown in FIG. 23(B) includes a first resistor $R_1$ and a capacitor C which are connected in parallel and a second resistor $R_2$. A third impedance converter circuit 450 shown in FIG. 23(C) includes a capacitor C, a second resistor $R_2$ and the coil L.

The semiconductor integrated circuit of this embodiment can be also produced by using almost the same producing process as the first embodiment described above and the width and the thickness of the micro strip line of the interconnect can be suitably determined so that at least one of the formulas (1) and (2) may be satisfied.

Further, in this embodiment, although the semiconductor integrated circuit using the bipolar transistors has been described, the same effects and advantages can be obtained in an integrated circuit using other devices such as the FETs of GaAs and the MOS transistors.

In FIG. 24, there is shown a semiconductor integrated circuit according to the fifth embodiment of the present invention. In this embodiment, the semiconductor integrated circuit includes first and second inverter circuits using complementary metal oxide semiconductor (CMOS) transistors and a interconnect 511 for coupling the first and the second inverter circuits.

The first inverter circuit includes an N type MOS (N-channel metal oxide semiconductor) transistor 502 and a P type MOS (P-channel metal oxide semiconductor) transistor 503. The second inverter circuit includes an N type MOS transistor 506 and a P type MOS transistor 507. More specifically, in the first inverter circuit, the gates of the N type MOS transistor 502 and the P type MOS transistor 503 are commonly coupled by a line connected to an input terminal 501. The drains of the N type MOS transistor 502 and the P type MOS transistor 503 are commonly coupled by a line connected to an output terminal 504. In the second inverter circuit, the gates of the N type MOS transistor 506 and the P type MOS transistor 507 are commonly coupled by a line connected to an input terminal 505. The drains of the N type MOS transistor 506 and the P TYPE MOS transistor 507 are commonly coupled by a line connected to an output terminal 508. The output terminal 504 of the first inverter circuit is coupled with the input terminal 505 of the second inverter circuit via the interconnect 511.

In this semiconductor integrated circuit, a matching between a characteristic impedance of the interconnect 511 and an output impedance of the first inverter circuit is executed so that an eye opening ratio may be larger than a predetermined value.

Then, a case of matching will be explanation between a characteristic impedance of the interconnect 511 and an output impedance of the first inverter circuit so as to satisfy the above-mentioned formulas (1) and (2) in detail. In this case, it is assumed that the output impedance of the first inverter circuit is $R_1$.

Figure 25:
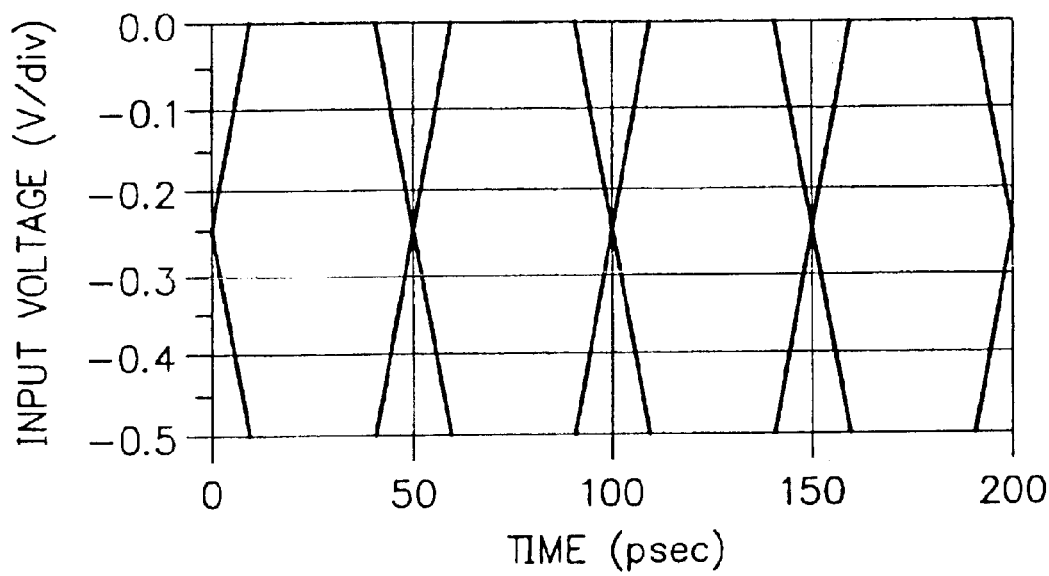
FIG. 25 is a graphical representation for explaining principle of showing an output impedance of the first inverter circuit of the semiconductor integrated circuit shown in FIG. 24.

In FIG. 25, there is shown an output impedance of the first inverter circuit at its output terminal 504 with reference to a frequency. The output impedance $R_1$ of the first inverter circuit is 400 Ω+j0 Ω~387 Ω−j55 Ω in the frequency range from DC to 1 GHz.

Figure 26:
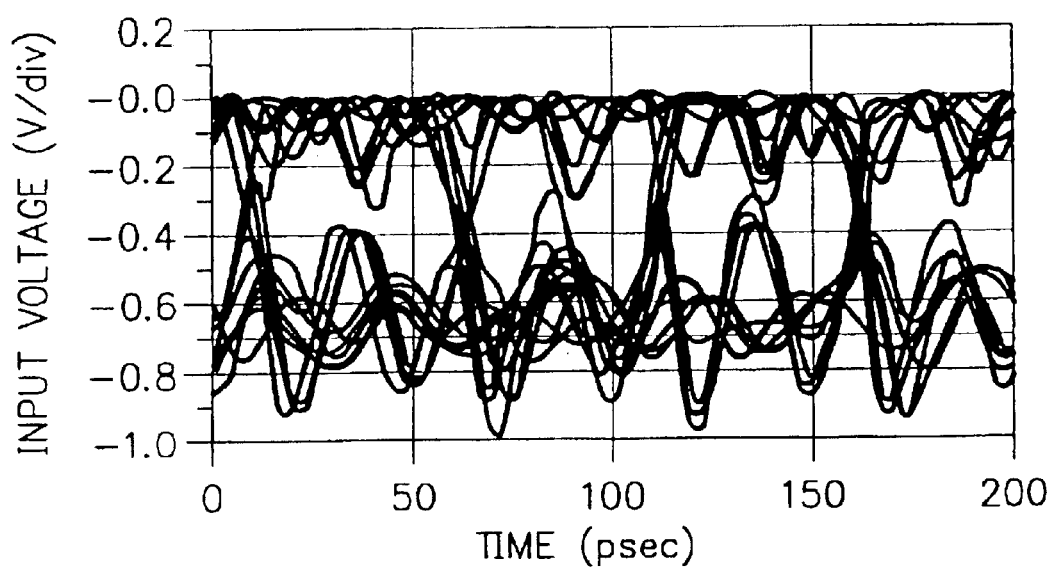
FIG. 26 is a cross sectional view showing a structure of interconnect for coupling the first and second inverter circuits in the semiconductor integrated circuit shown in FIG. 24.

In FIG. 26, there is shown a structure of the interconnect 511 for coupling the first and second inverter circuits of the semiconductor integrated circuit shown in FIG. 24. A central conductor 511a as a second interconnecting layer such as the interconnect 511 having a thickness of 0.4 μm and a width of 4 μm and grounds 511b as the second interconnecting layer, 20 μm apart from the central conductor 511a, are formed on an ground 520 as a first interconnecting layer (flat conductor plate) via an interlayer insulating film 521 of $SiO_2$ having a thickness of 0.4 μm, and its characteristic impedance $Z_0$ is approximately 390 Ω.

Now, it is estimated whether or not the formulas (1) and (2) are satisfied in the same manner as the aforementioned first embodiment wherein it is assumed that the necessary eye opening ratio M for the pulse signal propagating the interconnect is 0.8. Since both the right sides of the formulas (1) and (2) are 0.1, the real number part of the left side of the formula (1) becomes 0.013~0.004 and the real number part of the left side of the formula (2) becomes 0~0 (nearly equal 0). As a result, both the conditions of the formulas (1) and (2) are satisfied. Hence, in this embodiment, the characteristic impedance of the interconnect 511 matches the output impedance of the first inverter circuit. Thus, even when the interconnect length of the interconnect 511 is long such as 1 mm, no gain peaking occurs in the frequency characteristic and no distortion arises in the data signal. Hence, the amplitude and the propagation of the data signal can be correctly carried out.

The semiconductor integrated circuit of this embodiment can be also produced by using almost the same producing process as the first embodiment described above and the width and the thickness of the micro strip line of the interconnect can be suitably determined so that both the formulas (1) and (2) may be satisfied.

In this embodiment, although the semiconductor integrated circuit including the inverter circuits using the CMOS transistors has been described, however, an inverter such as a direct coupled FET logic (DCFL) circuit and a buffered FET logic (BFL) circuit using FETs of GaAs and other integrated circuits can constitute the semiconductor integrated circuit of the present invention.

In the present invention, although the matching between the characteristic impedance of the interconnect and the output impedance of the first integrated circuit at its output and between the characteristic impedance of the interconnect and the input impedance of the second integrated circuit at its input are conducted in the first, second, third and fifth embodiments described above, the impedance converter circuits can be placed at the input and the output of the interconnect to match its characteristic impedance, as described above with respect to the fourth embodiment.

In the semiconductor integrated circuit of the present invention, as described above, the impedance matching between the interconnect and its front and rear circuits can be carried out, but it is simple and desirable to match the characteristic impedance of the interconnect with a smaller variation impedance of the output impedance and the input impedance of the front and the rear circuits in the usage frequency range (the frequency range that the distortion is caused in the waveform of the data signal propagating the interconnect by the inductor or capacitance of the interconnect) from the viewpoint of the circuit designing.

As described above, according to the present invention, the occurrence of the distortion of the waveform of the data signal and the gain peaking of the frequency characteristic can be prevented, and hence the high-level signal processing with high reliability can be realized.

Furthermore, a layout of an integrated circuit can be produced regardless of interconnect lengths and the degree of freedom or flexibility in the designing of the semiconductor circuit can be improved.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor integrated circuit comprising:
   a first circuit having an output terminal;
   a second circuit having an input terminal; and
   an interconnect for connecting the output terminal of the first circuit and the input terminal of the second circuit, a characteristic impedance of the interconnect matching one of (1) output and/or input impedance of the first circuit, (2) an input impedance of the second circuit, and (3) an output impedance of the first circuit and an input impedance of the second circuit, in a predetermined frequency range,
   wherein the characteristic impedance of the interconnect is determined so that an eye opening ratio representing a rate of an amplitude size of an eye pattern of a data signal propagating in the interconnect to the amplitude size of the eye pattern of the data signal input may be larger than the predetermined value.

2. The semiconductor integrated circuit claimed in claim 1, further comprising an impedance converter circuit connected between the interconnect and one of the output terminal of the first circuit and the input terminal of the second circuit.

3. The semiconductor integrated circuit claimed in claim 2, wherein the predetermined frequency range includes a frequency that distortion is caused in a waveform of a data signal propagating the interconnect by either an inductor or capacitance of the interconnect.

4. The semiconductor integrated circuit claimed in claim 3, wherein the characteristic impedance of the interconnect is determined so that an eye opening ratio representing a rate of an amplitude size of an eye pattern of a data signal propagating the interconnect to the amplitude size of the eye pattern of the data signal input may be larger than a predetermined value.

5. The semiconductor integrated circuit claimed in claim 3, wherein the interconnect, the first circuit and the second circuit are formed on a same semiconductor substrate to obtain the semiconductor integrated circuit having a monolithic structure.

6. The semiconductor integrated circuit claimed in claim 2, wherein the characteristic impedance of the interconnect is determined so that an eye opening ratio representing a rate of an amplitude size of an eye pattern of a data signal propagating the interconnect to the amplitude size of the eye pattern of the data signal input may be larger than a predetermined value.

7. The semiconductor integrated circuit claimed in claim 2, wherein the interconnect, the first circuit and the second circuit are formed on a same semiconductor substrate to obtain the semiconductor integrated circuit having a monolithic structure.

8. The semiconductor integrated circuit claimed in claim 1, wherein the predetermined frequency range includes a frequency that distortion is caused in a waveform of a data signal propagating the interconnect by either an inductor or capacitance of the interconnect.

9. The semiconductor integrated circuit claimed in claim 8, wherein the characteristic impedance of the interconnect is determined so that an eye opening ratio representing a rate of an amplitude size of an eye pattern of a data signal propagating the interconnect to the amplitude size of the eye pattern of the data signal input may be larger than a predetermined value.

10. The semiconductor integrated circuit claimed in claim 8, wherein the interconnect, the first circuit and the second circuit are formed on a same semiconductor substrate to obtain the semiconductor integrated circuit having a monolithic structure.

11. The semiconductor integrated circuit claimed in claim 1, wherein assuming that the output impedance of the first circuit, the input impedance of the second circuit, the characteristic impedance of the interconnect and the eye opening ratio are $R_1$, $R_2$, $Z_0$ and M, respectively, these values satisfy both of the following formulas in a frequency range for the data signal propagating the interconnect;

$$\left|\frac{Z_0}{Z_0+R_1}[1+\frac{R_2-Z_0}{R_2+Z_0}]-\frac{R_2}{R_1+R_2}\right| < \frac{1-M}{2}$$

$$\left|\frac{Z_0}{Z_0+R_1}[1+\frac{R_2-Z_0}{R_2+Z_0}][1+\frac{R_2-Z_0}{R_2+Z_0}*\frac{R_2-Z_0}{R_1+R_2}]-\frac{R_2}{R_1+R_2}\right| <$$

$$\frac{1-M}{2}.$$

12. The semiconductor integrated circuit claimed in claim 11, wherein the interconnect, the first circuit and the second circuit are formed on a same semiconductor substrate to obtain the semiconductor integrated circuit having a monolithic structure.

13. The semiconductor integrated circuit claimed in claim 1, wherein assuming that the output impedance of the first circuit, the input impedance of the second circuit, the characteristic impedance of the interconnect and the eye opening ratio are $R_1$, $R_2$, $Z_0$ and M, respectively, these values satisfy the following formula in a frequency range for the data signal propagating the interconnect;

$$\left|\frac{Z_0}{Z_0+R_1}[1+\frac{R_2-Z_0}{R_2+Z_0}]-\frac{R_2}{R_1+R_2}\right| < \frac{1-M}{2}.$$

14. The semiconductor integrated circuit claimed in claim 1, wherein assuming that the output impedance of the first circuit, the input impedance of the second circuit, the characteristic impedance of the interconnect and the eye opening ratio are $R_1$, $R_2$, $Z_0$ and M, respectively, these values satisfy the following formula in a frequency range for the data signal propagating the interconnect;

$$\left|\frac{Z_0}{Z_0+R_1}[1+\frac{R_2-Z_0}{R_2+Z_0}][1+\frac{R_1-Z_0}{R_1+Z_0}*\frac{R_2-Z_0}{R_2+Z_0}]-\frac{R_2}{R_1+R_2}\right| < \frac{1-M}{2}.$$

15. The semiconductor integrated circuit claimed in claim 1, wherein the interconnect, the first circuit and the second circuit are formed on a same semiconductor substrate to obtain the semiconductor integrated circuit having a monolithic structure.

16. The semiconductor integrated circuit claimed in claim 1, wherein the interconnect, the first circuit and the second circuit are formed on a same semiconductor substrate to obtain the semiconductor integrated circuit having a monolithic structure.

17. The semiconductor integrated circuit claimed in claim 1, further comprising:
an impedance converter circuit connected between the interconnect and one of the output terminal of the first circuit and the input terminal of the second circuit.

18. The semiconductor integrated circuit claimed in claim 17 wherein the characteristic impedance of the interconnect is determined so that an eye opening ratio representing a rate of an amplitude size of an eye pattern of a data signal propagating in the interconnect to the amplitude size of the eye pattern of the data signal input may be larger than a predetermined value.

19. The semiconductor integrated circuit claimed in claim 18, wherein the interconnect, the first circuit and the second circuit are formed on a same semiconductor substrate to obtain the semiconductor integrated circuit having a monolithic structure.

20. The semiconductor integrated circuit claimed in claim 1 further comprising:
an impedance converter circuit connected between the interconnect and one of the cutout terminal of the first circuit and the input terminal of the second circuit, and
wherein the predetermined frequency range includes a frequency that distortion is caused in a waveform of a data signal propagating the interconnect by either an inductor or capacitance of the interconnect.

21. The semiconductor integrated circuit claimed in claim 20, wherein the characteristic impedance of the interconnect is determined so that an eye opening ratio representing a rate of an amplitude size of an eye pattern of a data signal propagating the interconnect to the amplitude size of the eye pattern of the data signal input may be larger than a predetermined value.

22. The semiconductor integrated circuit claimed in claim 20, wherein the interconnect, the first circuit and the second circuit are formed on a same semiconductor substrate to obtain the semiconductor integrated circuit having a monolithic structure.

23. A method for producing a semiconductor integrated circuit, comprising the steps of:
forming a first circuit having an output terminal and a second circuit having an input terminal on a semiconductor substrate; and
forming interconnect for connecting the output terminal of the first circuit and the input terminal of the second circuit, a characteristic impedance of the interconnect being determined so that an eye opening ratio representing a rate of an amplitude size of an eye pattern of a data signal propagating in the interconnect to the amplitude size of the eye pattern of the data signal input may be larger than a predetermined value.

24. A The method for producing a semiconductor integrated circuit claimed in claim 23, wherein assuming that an output impedance of the first circuit, an input impedance of the second circuit, the characteristic impedance of the interconnect and the eye opening ratio are $R_1$, $R_2$, $Z_0$ and M, respectively, these values satisfy both of the following formulas in a frequency range for the data signal propagating the interconnect;

$$\left|\frac{Z_0}{Z_0+R_1}[1+\frac{R_2-Z_0}{R_2+Z_0}]-\frac{R_2}{R_1+R_2}\right| < \frac{1-M}{2}$$

$$\left|\frac{Z_0}{Z_0+R_1}[1+\frac{R_2-Z_0}{R_2+Z_0}][1+\frac{R_2-Z_0}{R_2+Z_0}*\frac{R_2-Z_0}{R_1+R_2}]-\frac{R_2}{R_1+R_2}\right| <$$

$$\frac{1-M}{2}.$$

25. The method for producing a semiconductor integrated circuit claimed in claim 24, further comprising the steps of forming an impedance converter circuit connected between the interconnect and the output terminal of the first circuit, for converting an output impedance of the first circuit, wherein it is assumed that the output impedance, converted by the impedance converter circuit, of the first circuit is $R_1$.

26. The method for producing a semiconductor integrated circuit claimed in claim 24, further comprising the steps of forming an impedance converter circuit connected between the interconnect and the input terminal of the second circuit, for converting an output impedance of the first circuit, wherein it is assumed that the input impedance, converted by the impedance converter circuit, of the second circuit is $R_2$.

27. The method for producing a semiconductor integrated circuit claimed in claim 23, wherein assuming that an output impedance of the first circuit, an input impedance of the second circuit, the characteristic impedance of the interconnect and the eye opening ratio are $R_1$, $R_2$, $Z_0$ and M, respectively, these values satisfy the following formula in a frequency range for the data signal propagating the interconnect;

$$\left| \frac{Z_0}{Z_0 + R_1} \left[ 1 + \frac{R_2 - Z_0}{R_2 + Z_0} \right] - \frac{R_2}{R_1 + R_2} \right| < \frac{1 - M}{2}.$$

28. The method for producing a semiconductor integrated circuit claimed in claim 27, further comprising the steps of forming an impedance converter circuit connected between the interconnect and the output terminal of the first circuit, for converting an output impedance of the first circuit, wherein it is assumed that the output impedance, converted by the impedance converter circuit, of the first circuit is $R_1$.

29. The method for producing a semiconductor integrated circuit claimed in claim 27, further comprising the steps of forming an impedance converter circuit connected between the interconnect and the input terminal of the second circuit, for converting an output impedance of the first circuit, wherein it is assumed that, the input impedance, converted by the impedance converter circuit, of the second circuit is $R_2$.

30. The method for producing a semiconductor integrated circuit claimed in claim 23, wherein assuming that an output impedance of the first circuit, an input impedance of the second circuit, the characteristic impedance of the interconnect and the eye opening ratio are $R_1$, $R_2$, $Z_0$ and M, respectively, these values satisfy the following formula in a frequency range for the data signal propagating the interconnect;

$$\left| \frac{Z_0}{Z_0 + R_1} \left[ 1 + \frac{R_2 - Z_0}{R_2 + Z_0} \right] \left[ 1 + \frac{R_1 - Z_0}{R_1 + Z_0} * \frac{R_2 - Z_0}{R_2 + Z_0} \right] - \frac{R_2}{R_1 + R_2} \right| < \frac{1 - M}{2}.$$

31. The method for producing a semiconductor integrated circuit claimed in claim 30, further comprising the steps of forming an impedance converter circuit connected between the interconnect and the output terminal of the first circuit, for converting an output impedance of the first circuit, wherein it is assumed that the output impedance, converted by the impedance converter circuit, of the first circuit is $R_1$.

32. The method for producing a semiconductor integrated circuit claimed in claim 30, further comprising the steps of forming an impedance converter circuit connected between the interconnect and the input terminal of the second circuit, for converting an output impedance of the first circuit, wherein it is assumed that the input impedance, converted by the impedance converter circuit, of the second circuit is $R_2$.

33. A semiconductor integrated circuit comprising:
    a first circuit having an output terminal;
    a second circuit having an input terminal; and
    an interconnect for connecting the output terminal of the first circuit and the input terminal of the second circuit, a characteristic impedance of the interconnect matching one of (1) an output and/or input impedance of the first circuit, (2) an input impedance of the second circuit, and (3) an output impedance of the first circuit and an input impedance of the second circuit, in a predetermined frequency range,
    wherein the predetermined frequency range includes a frequency that distortion is caused in a waveform of a data signal propagating in the interconnect by either an inductor or capacitance of the interconnect.

34. The semiconductor integrated circuit claimed in claim 33, wherein the characteristic impedance of the interconnect is determined so that an eye opening ratio representing a rate of an amplitude size of an eye pattern of a data signal propagating the interconnect to the amplitude size of the eye pattern of the data signal input may be larger than a predetermined value.

35. The semiconductor integrated circuit claimed in claim 33, wherein the interconnect, the first circuit and the second circuit are formed on a same semiconductor substrate to obtain the semiconductor integrated circuit having a monolithic structure.

* * * * *